(12) United States Patent
Forbes

(10) Patent No.: US 12,284,775 B1
(45) Date of Patent: Apr. 22, 2025

(54) INTEGRATED PORTABLE ELECTRONIC DEVICE SYSTEM

(71) Applicant: Pioneer Square Brands, Inc., High Point, NC (US)

(72) Inventor: Quentin Wade Forbes, Winston Salem, NC (US)

(73) Assignee: Pioneer Square Brands, Inc., High Point, NC (US)

( * ) Notice: Subject to any disclaimer, the term of this patent is extended or adjusted under 35 U.S.C. 154(b) by 0 days.

(21) Appl. No.: 18/936,464

(22) Filed: Nov. 4, 2024

(51) Int. Cl.
| | | |
|---|---|---|
| *H05K 5/02* | (2006.01) | |
| *G06F 3/14* | (2006.01) | |
| *H05K 5/00* | (2006.01) | |

(52) U.S. Cl.
CPC ............ *H05K 5/0247* (2013.01); *G06F 3/14* (2013.01); *H05K 5/0086* (2013.01)

(58) Field of Classification Search
None
See application file for complete search history.

(56) References Cited

U.S. PATENT DOCUMENTS

| | | | | |
|---|---|---|---|---|
| 10,646,170 | B2 * | 5/2020 | Eslava ................. | A61B 5/7445 |
| 11,218,007 | B1 * | 1/2022 | Moubedi ............... | H02J 7/0042 |
| 11,567,537 | B2 * | 1/2023 | DeCamp ................ | G09G 5/363 |
| 2016/0085280 | A1 * | 3/2016 | Harel ..................... | G06F 1/3287 |
| | | | | 710/14 |
| 2016/0141822 | A1 * | 5/2016 | Hijazi ................. | H01R 13/6595 |
| | | | | 29/842 |
| 2016/0233632 | A1 * | 8/2016 | Scruggs ................. | H01R 24/62 |
| 2019/0288453 | A1 * | 9/2019 | Blake .................. | H01R 13/6683 |
| 2020/0201388 | A1 * | 6/2020 | Spyrison ................ | F16M 11/10 |
| 2020/0228166 | A1 * | 7/2020 | Scherer ..................... | H02J 7/02 |
| 2021/0072792 | A1 * | 3/2021 | DeCamp ............. | G06F 13/4022 |
| 2021/0191462 | A1 * | 6/2021 | DeCamp ............... | G06F 1/1632 |
| 2022/0029366 | A1 * | 1/2022 | Cross ...................... | G09G 5/003 |
| 2022/0123573 | A1 * | 4/2022 | Moubedi ................. | H02J 7/007 |
| 2023/0421259 | A1 * | 12/2023 | Tong .................... | H04B 10/806 |
| 2024/0184728 | A1 * | 6/2024 | Gagne-Keats ...... | G06F 13/4022 |
| 2024/0421525 | A1 * | 12/2024 | Schaub .................. | H01R 43/26 |

* cited by examiner

*Primary Examiner* — Xanthia C Relford
(74) *Attorney, Agent, or Firm* — Grandview Law

(57) ABSTRACT

A system includes an electrical cable first end having external electrical pins, an electrical cable second end having a data-video-power port connector, and an electrical cable coupled to the first end and the second end. Implementations of the plurality of external electrical pins can include 18 pogo pins. Implementations of the data-video-power port connector can be compliant with Universal Serial Bus (USB) specification standards. A portable electronic device stand can include a base assembly with a wall assembly extending from the base assembly and a portable electronic device support assembly coupled with the wall assembly. The electrical cable first end can couple with the wall assembly and extend from the electrical cable first end through the wall assembly and on from the portable electronic device stand. Other aspects are described in the claims, drawings, and text forming a part of the present disclosure.

19 Claims, 24 Drawing Sheets

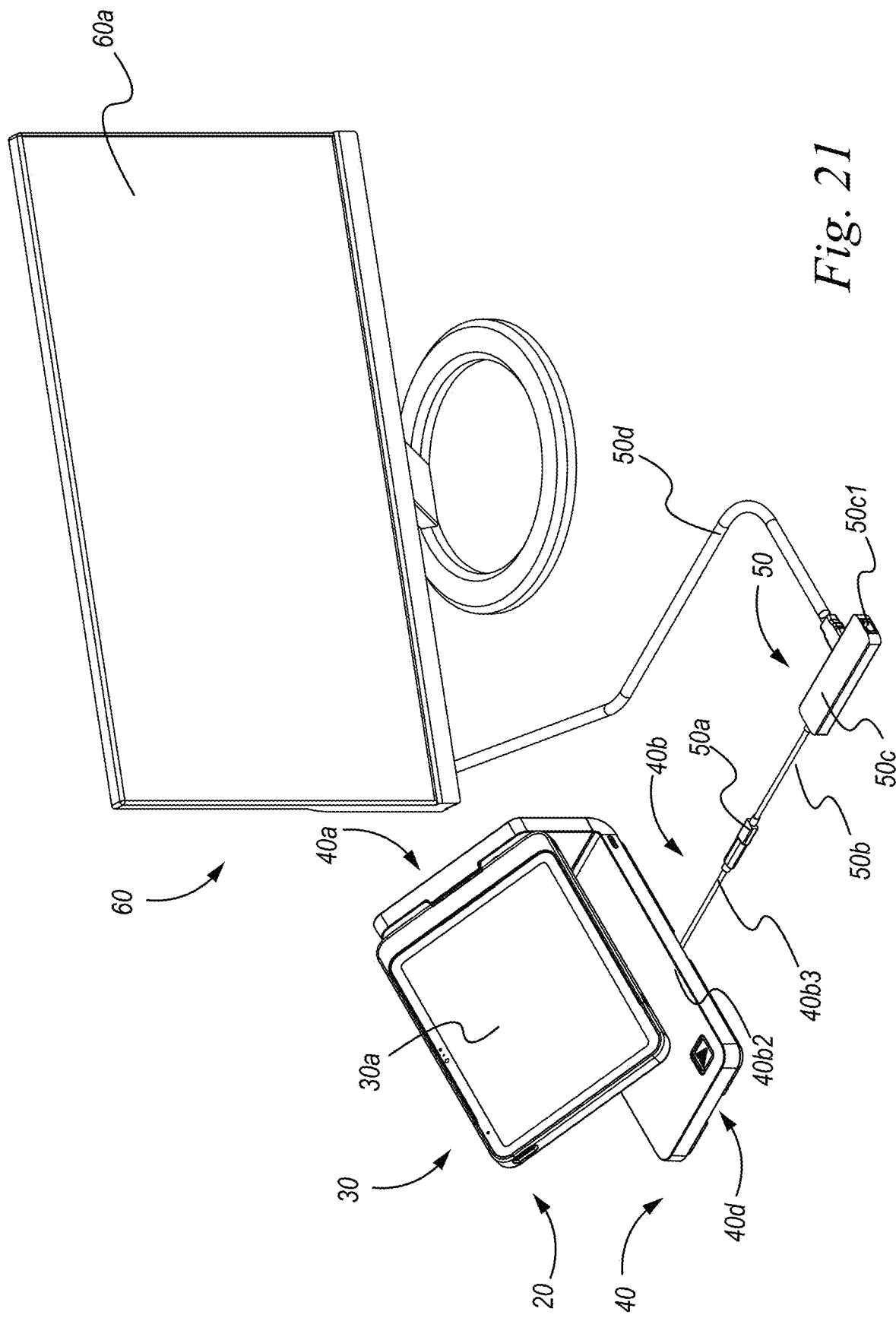

INTEGRATED PORTABLE ELECTRONIC DEVICE SYSTEM

SUMMARY

A data-video-power system includes (I) a data-video-power electrical cable first end having an electrical contact pin connector array; (II) a data-video-power electrical cable second end having a data-video-power connector port; and (III) a data-video-power electrical cable coupled to the data-video-power cable first end and the data-video-power cable second end.

In implementations the electrical contact pin connector array is an array of electrical contact pogo pins.

In implementations the data-video-power connector port is configured to conduct data signals, video signals, and electrical power according to at least one version of Universal Serial Bus (USB) specification standards.

Implementations further include a portable electronic device stand wherein the portable electronic device stand includes a base assembly, wherein the portable electronic device stand includes a wall assembly extending from the base assembly, wherein the portable electronic device stand includes a portable electronic device support assembly coupled with the wall assembly, wherein the data-video-power electrical cable first end is coupled with the wall assembly, and wherein the data-video-power electrical cable extends from the data-video-power electrical cable first end at least through a portion of the wall assembly and with a portion of the data-video-power electrical cable extending from the portable electronic device stand.

Implementations include a data-video-power connector port hub assembly wherein the data-video-power connector port hub assembly includes a plurality of data-video-power connector ports, and wherein the data-video-power connector port hub assembly includes a data-video-power electrical connector plug electrically couplable with the data-video-power connector port of the data-video-power electrical cable second end.

Implementations include a display monitor assembly and a data-video electrical cable, wherein the data-video electrical cable includes at least one connector plug configured to conduct data signals and video signals according to at least one version of Universal Serial Bus (USB) specification standards, wherein the plurality of data-video-power connector ports is configured to conduct data signals, video signals, and electrical power according to at least one version of Universal Serial Bus (USB) specification standards, and wherein the display monitor assembly is electrically couplable to the data-video-power connector port hub assembly via the data-video electrical cable.

A system for a portable electronic device including a data-video-power connector port includes (I) a case for coupling with the portable electronic device; and (II) a portable electronic device accessory; wherein the portable electronic device accessory is couplable to the case, wherein the portable electronic device accessory includes a data-video-power electrical connector plug couplable with the data-video-power connector port of the portable electronic device, wherein the portable electronic device accessory includes an electrical contact pogo pin target connector array, and wherein the portable electronic device accessory conducts data signals, video signals, and electrical power received by the electrical contact pogo pin target connector array on to the data-video-power electrical connector plug.

In implementations the data-video-power electrical connector plug is configured to conduct data signals, video signals, and electrical power according to at least one version of Universal Serial Bus (USB) specification standards.

In implementations the electrical contact pogo pin target connector array includes eighteen external electrical pogo pin target contracts directly electrically coupled to the data-video-power electrical connector plug.

Implementations include a portable electronic device stand wherein the portable electronic device stand includes a base assembly, wherein the portable electronic device stand includes a wall assembly extending from the base assembly, wherein the portable electronic device stand includes a portable electronic device support assembly coupled with the wall assembly, wherein the portable electronic device stand includes a data-video-power electrical cable with a data-video-power electrical cable first end coupled with the wall assembly and a data-video-power electrical cable second end having a data-video-power connector port, wherein the data-video-power electrical cable first end of the electrical cable is electrically couplable with the electrical contact pogo pin target connector array of the portable electronic device accessory, and wherein the data-video-power electrical cable extends from the cable first end at least through a portion of the wall assembly with a portion of the data-video-power electrical cable extending from the portable electronic device stand.

Implementations include a data-video-power connector port hub assembly wherein the data-video-power connector port hub assembly includes a data-video-power electrical connector plug electrically couplable with the data-video-power connector port of the data-video-power electrical cable.

Implementations include a display monitor assembly wherein the display monitor assembly is electrically couplable with the data-video-power connector port hub assembly via a data-video electrical cable.

In implementations the data-video-power electrical cable first end includes eighteen external electrical pogo pins of an electrical contact pogo pin connector array, and wherein the data-video-power connector port of the data-video-power electrical cable second end is configured to conduct data signals, video signals, and electrical power according to at least one version of Universal Serial Bus (USB) specification standards.

A system for a portable electronic device including a data-video-power connector port includes (I) a portable electronic device stand including a base assembly, a wall assembly extending from the base assembly, a portable electronic device support assembly coupled with the wall assembly, a data-video-power electrical cable with a data-video-power electrical cable first end coupled with the wall assembly and a data-video-power electrical cable second end having a data-video-power connector port, (II) a portable electronic device accessory including an electrical contact pogo pin target connector array and a data-video-power electrical connector plug, wherein the electrical contact pogo pin target connector array is directly electrically coupled with the data-video-power electrical connector plug so that data signals, video signals, and electrical power received by the electrical contact pogo pin target connector array is conducted on to the data-video-power electrical connector plug, wherein the data-video-power electrical cable first end of the data-video-power electrical cable is electrically couplable with an electrical contact pogo pin target connector array of the portable electronic device accessory, and wherein the data-video-power electrical cable extends from the cable first end at least through a portion of the wall assembly with a portion of the data-video-power electrical cable extending from the portable electronic device stand.

Implementations include a data-video-power connector port hub assembly wherein the data-video-power connector port hub assembly includes a data-video-power electrical connector plug electrically couplable with the data-video-power connector port of the data-video-power electrical cable.

Implementations include a display monitor assembly wherein the display monitor assembly is electrically couplable with the data-video-power connector port hub assembly via a data-video electrical cable.

In implementations the data-video-power electrical cable first end includes an array of eighteen electrical pogo pins of an electrical contact pogo pin connector array, and wherein the data-video-power connector port of the data-video-power electrical cable second end is configured to conduct data signals, video signals, and electrical power according to at least one version of Universal Serial Bus (USB) specification standards.

In implementations the electrical contact pogo pin target connector array of the portable electronic device accessory includes an array of eighteen electrical contact pogo pin targets, and wherein the data-video-power electrical connector plug is is configured to conduct data signals, video signals, and electrical power according to at least one version of Universal Serial Bus (USB) specification standards.

Implementations include a case for coupling with the portable electronic device; wherein the portable electronic device accessory is couplable to the case.

In implementations the data-video-power electrical connector plug of portable electronic device accessory is configured to conduct data signals, video signals, and electrical power according to at least one version of Universal Serial Bus (USB) specification standards.

In addition to the foregoing, other aspects are described in the claims, drawings, and text forming a part of the disclosure set forth herein. Various other aspects are set forth and described in the teachings such as text (e.g., claims and/or detailed description) and/or drawings of the present disclosure. The foregoing is a summary and thus may contain simplifications, generalizations, inclusions, or omissions of detail; consequently, those skilled in the art will appreciate that the summary is illustrative only and is NOT intended to be in any way limiting. Other aspects, features, and advantages of the devices and/or processes and/or other subject matter described herein will become apparent in the teachings set forth herein.

BRIEF DESCRIPTION OF THE FIGURES

FIG. 21 is a front perspective view of the case assembly of FIG. 5 coupled with the portable electronic device of FIG. 14, which are both coupled with the portable electronic device stand of FIG. 16 being coupled with the data-video-power connector port hub assembly of FIG. 20, which is coupled with a monitor display.

For a more complete understanding of implementations, reference now is made to the following descriptions taken in connection with the accompanying drawings. The use of the same symbols in different drawings typically indicates similar or identical items, unless context dictates otherwise.

Figure 1:
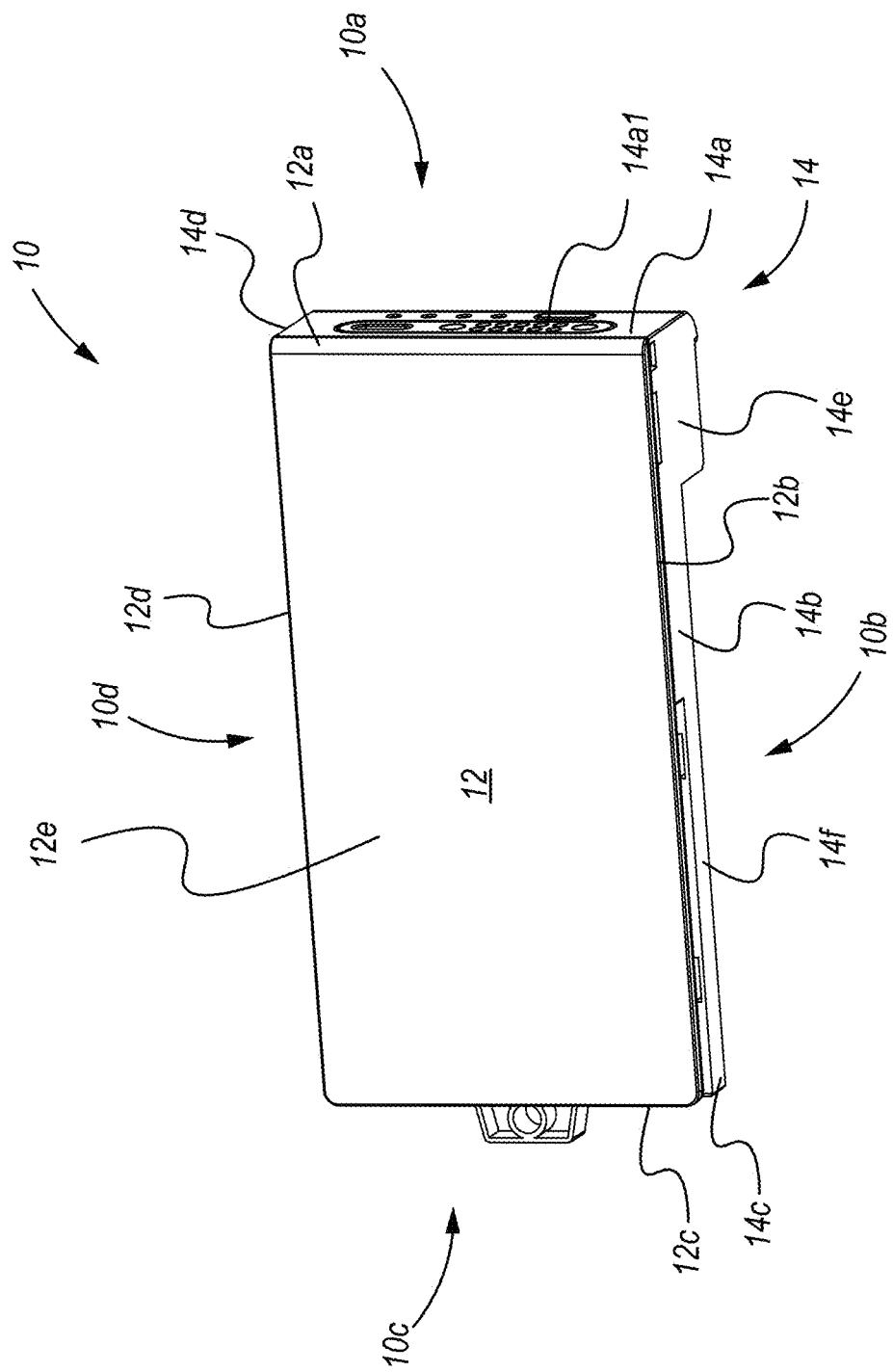
FIG. 1 is a top perspective view of an accessory assembly.

With reference now to the figures, shown are one or more examples of Integrated Portable Electronic Device System, articles of manufacture, compositions of matter for same that may provide context, for instance, in introducing one or more processes and/or devices described herein.

DETAILED DESCRIPTION

In the following detailed description, reference is made to the accompanying drawings, which form a part hereof. In the drawings, similar symbols typically identify similar components, unless context dictates otherwise. The illustrative implementations described in the detailed description, drawings, and claims are not meant to be limiting. Other implementations may be utilized, and other changes may be made, without departing from the spirit or scope of the subject matter presented here.

Turning to FIG. 1, depicted therein is a top perspective view of an accessory assembly 10. Depicted implementation of accessory assembly 10 is shown to include cover component 12 and accessory component 14. Depicted implementation of accessory assembly 10 is shown to include side 10a, side 10b, side 10c, and side 10d. Depicted implementation of cover component 12 is shown to include side 12a, side 12b, side 12c, and side 12d. Depicted implementation of accessory component 14 is shown to include side 14a with electrical contact pogo pin target connector array 14a1 (e.g., an array of flat or concave metal contact surfaces, etc.), side 14b, side 14c, side 14d, base portion 14e, and extended portion 14f.

Figure 2:
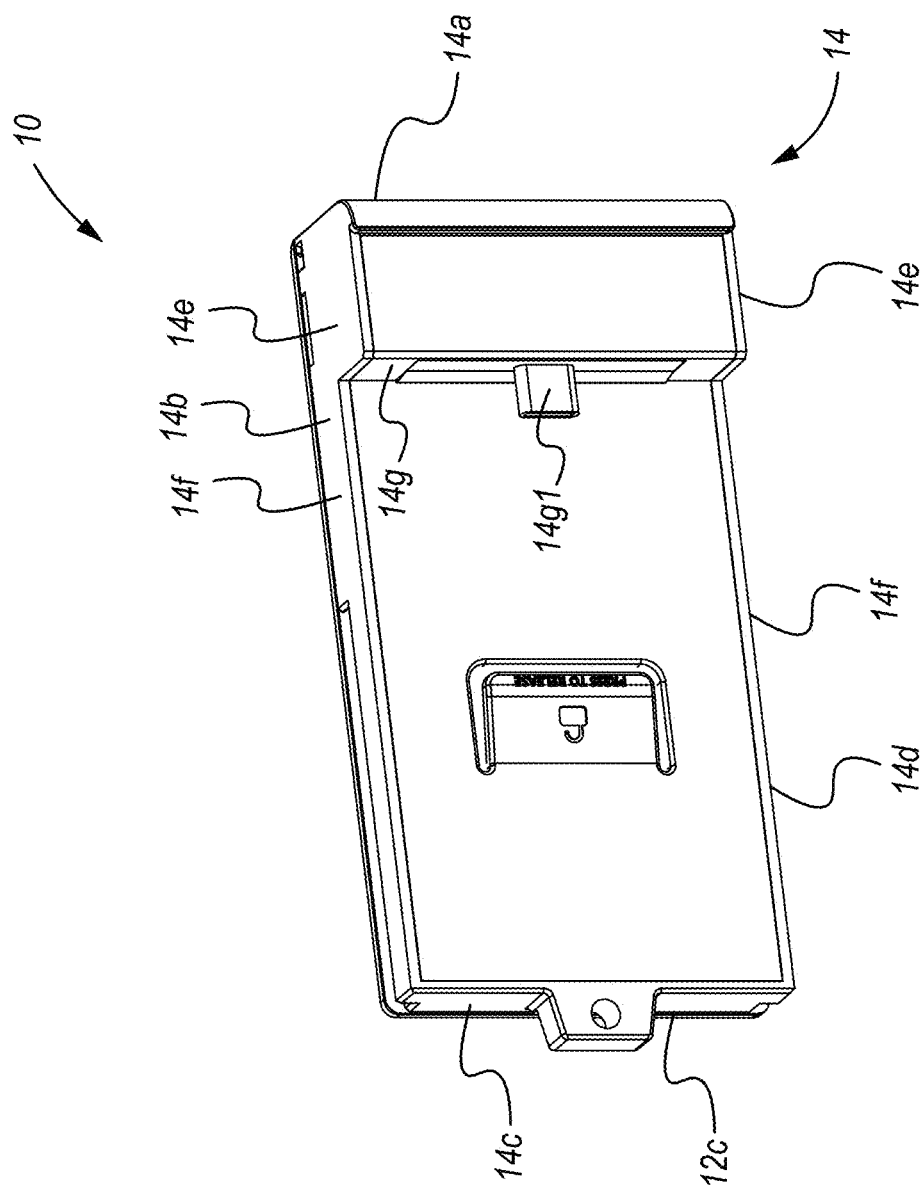
FIG. 2 is a bottom perspective view of the accessory assembly of FIG. 1.

Turning to FIG. 2, depicted therein is a bottom perspective view of accessory assembly 10. Depicted implementation of accessory component 14 is shown to include interior face 14g with data-video-power electrical connector plug 14g1 (e.g., using one or more of those Universal Serial Bus (USB) specification standards connector plug versions that can conduct data signals, video signals, and electrical power). As a reference to such USB specification standards, according to its website usb dot org, "USB Implementers Forum, Inc. [(USB-IF)] is a non-profit corporation founded by the group of companies that developed the USB specification. The USB-IF was formed to provide a support organization and forum for the advancement and adoption of Universal Serial Bus technology. The Forum facilitates the development of high-quality compatible USB peripherals (devices), and promotes the benefits of USB and the quality products that have passed compliance testing."

In implementations accessory component 14 conducts all data signals, video signals, and electrical power received by the electrical contact pogo pin target connector array 14a1 directly on to data-video-power electrical connector plug 14g1. In implementations accessory component 14 conducts all data signals and video signals power received by data-video-power electrical connector plug 14g1 directly on to electrical contact pogo pin target connector array 14a1.

Figure 3:
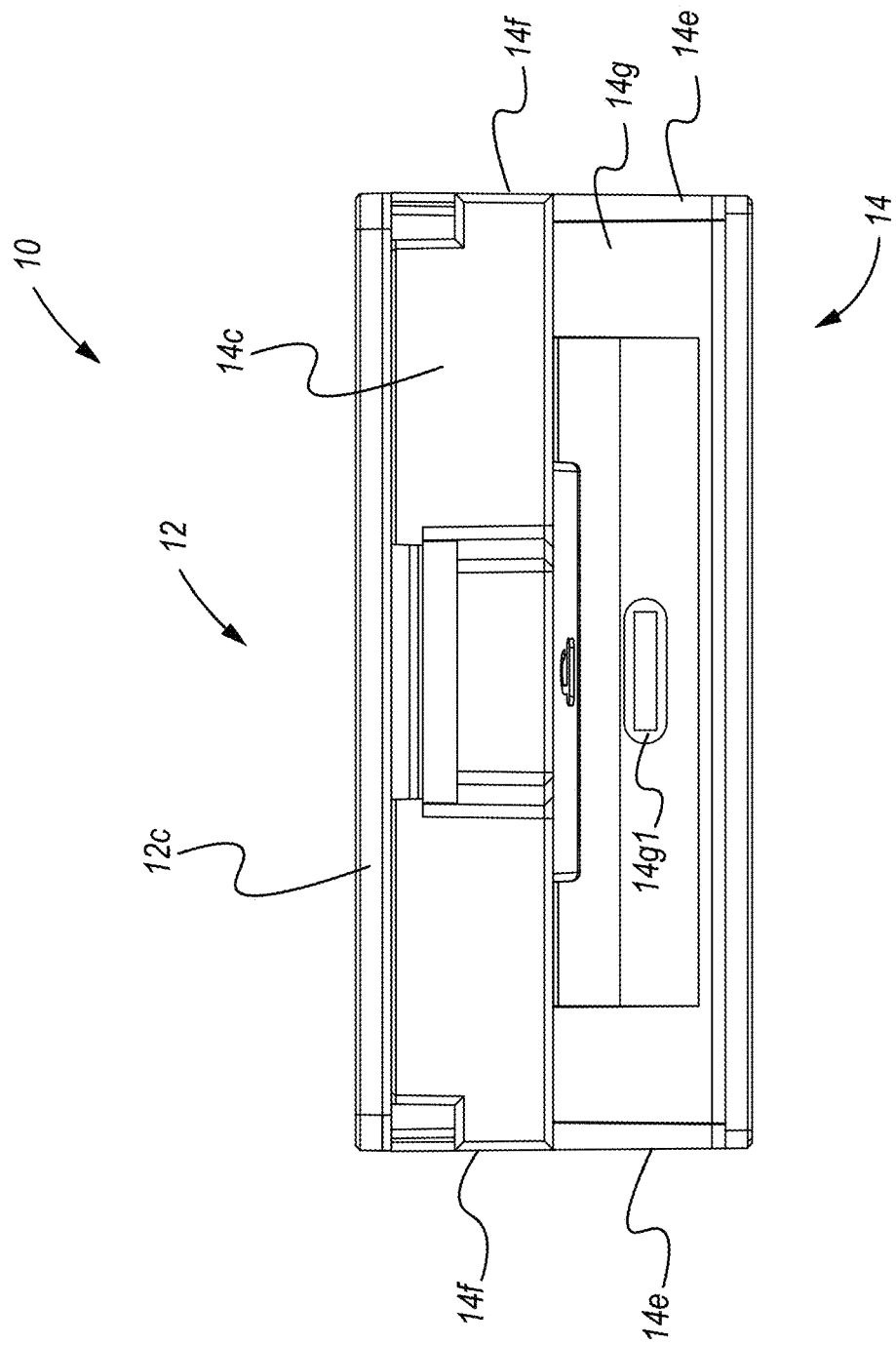
FIG. 3 is a rear elevational view of the accessory assembly of FIG. 1.

Turning to FIG. 3, depicted therein is a rear elevational view of accessory assembly 10.

Figure 4:
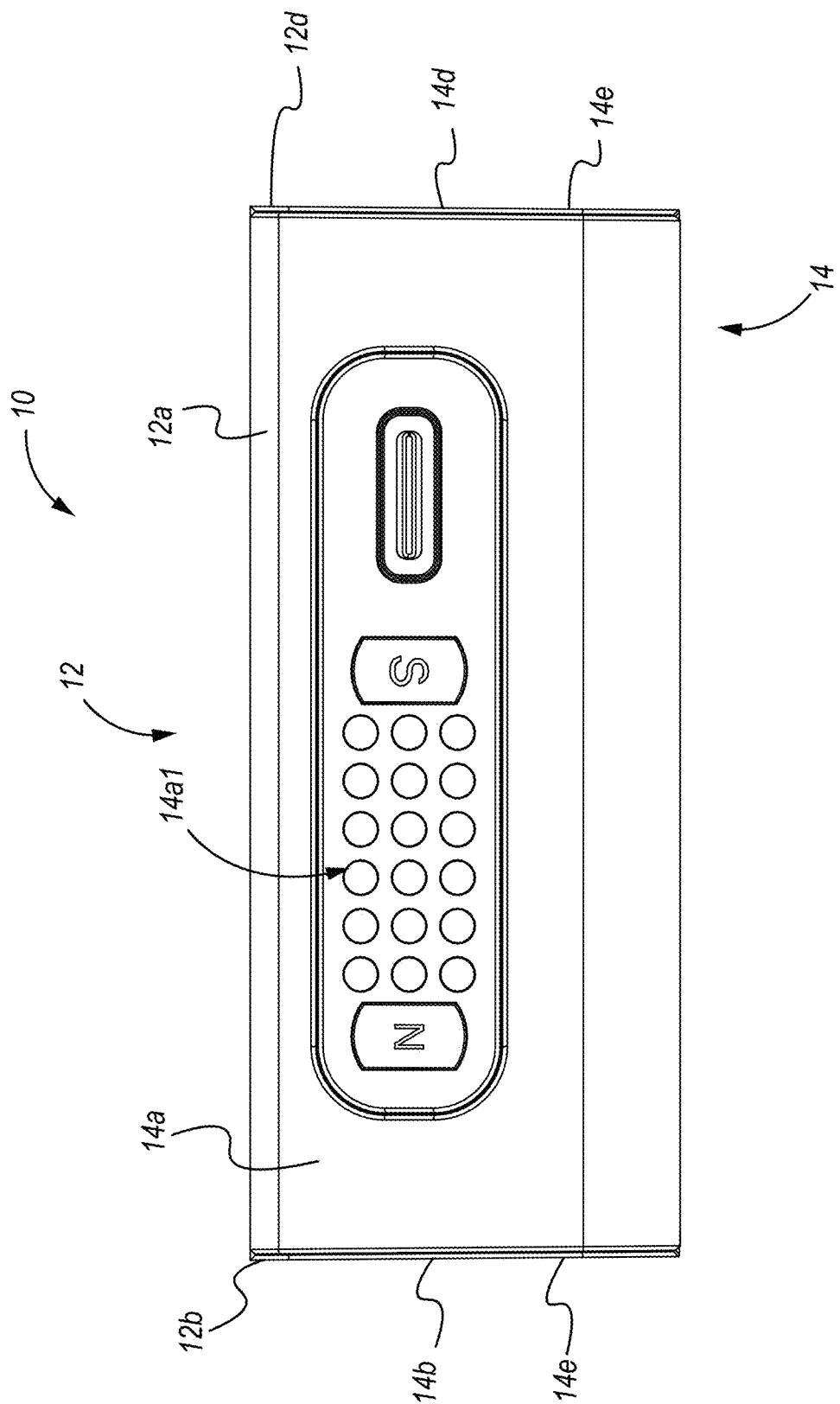
FIG. 4 is a front elevational view of the accessory assembly of FIG. 1.

Turning to FIG. 4, depicted therein is a front elevational view of accessory assembly 10.

Figure 4A:
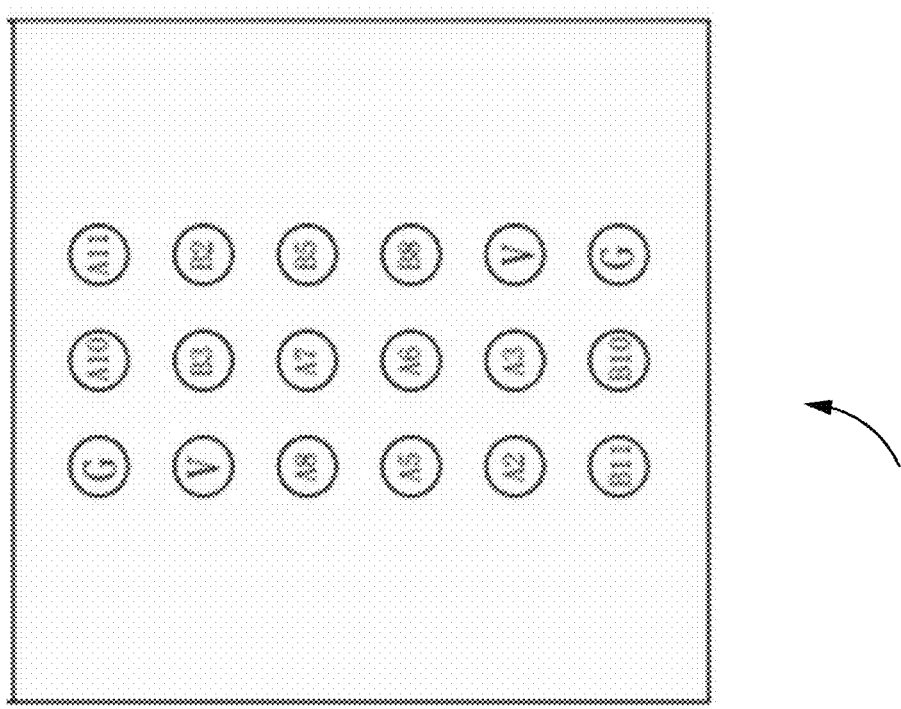
FIG. 4A is an electrical contact definition matrix associated with the accessory assembly of FIG. 1.

Turning to FIG. 4A, depicted therein is an electrical contact definition matrix associated with electrical contact pogo pin target connector array 14a1 of accessory assembly 10. The electrical contact definition matrix is arranged to accommodate pinout mapping of electrical contact pogo pin target connector array 14a1 to data-video-power electrical connector plug 14g1 (e.g., using one or more of those Universal Serial Bus (USB) specification standards connector plug versions that can conduct data signals, video signals, and electrical power).

Figure 5:
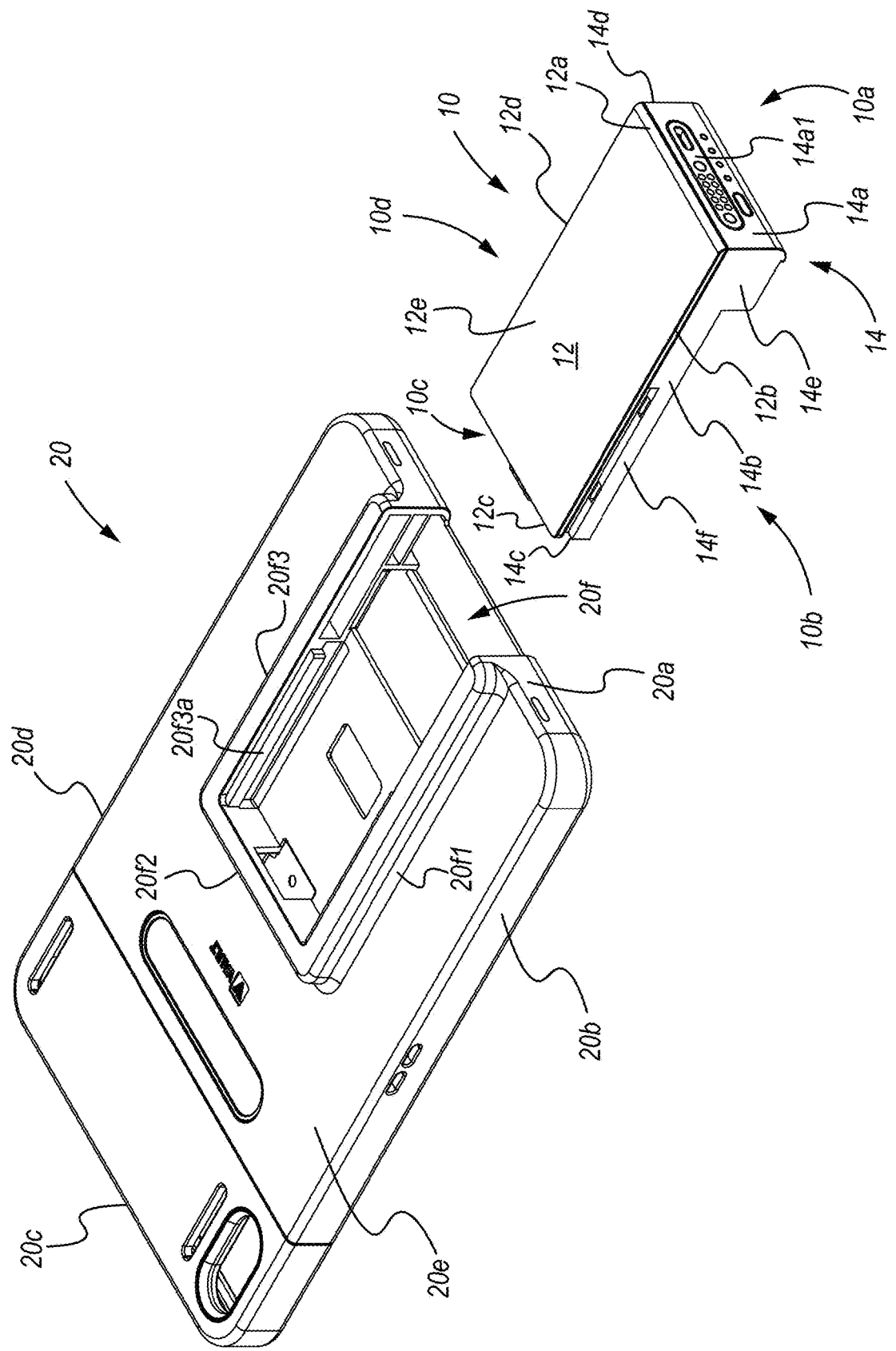
FIG. 5 is a top perspective view of a case assembly uncoupled from the accessory assembly of FIG. 1.

Turning to FIG. 5, depicted therein is a top perspective view of case assembly 20 uncoupled from accessory assembly 10. Depicted implementation of case assembly 20 is shown to include side 20a, end 20b, side 20c, end 20d, upper portion 20e, and docking bay 20f. Depicted implementation of docking bay 20f is shown to include wall 20f1, wall 20f2, and wall 20f3 with engagement rail 20f3a.

Figure 6:
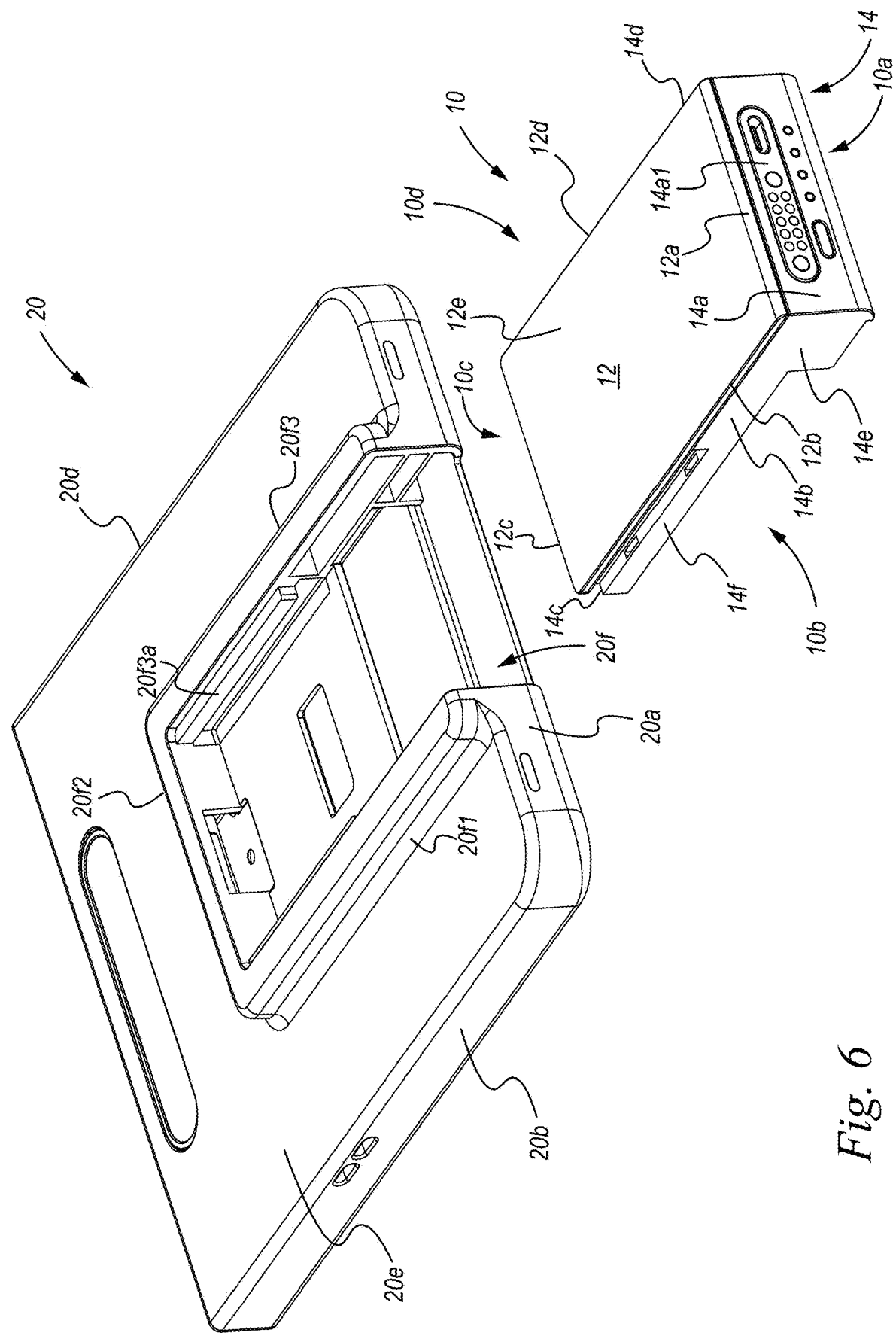
FIG. 6 is an enlarged top perspective view of a portion of the case assembly of FIG. 5 uncoupled from the accessory assembly of FIG. 1.

Turning to FIG. 6, depicted therein is an enlarged top perspective view of a portion of case assembly 20 uncoupled from accessory assembly 10.

Figure 7:
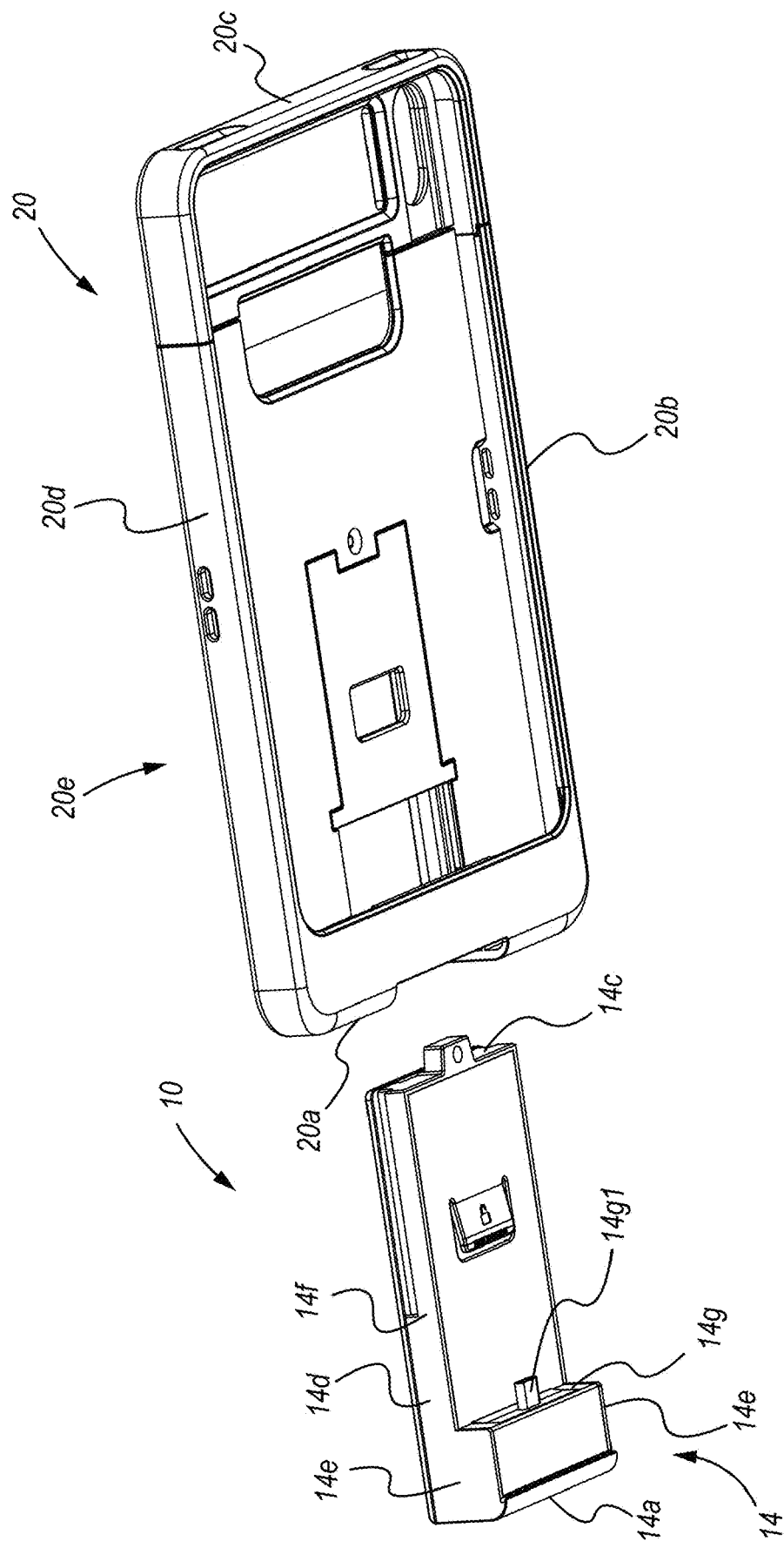
FIG. 7 is a bottom perspective view of the case assembly of FIG. 5 uncoupled from the accessory assembly of FIG. 1.

Turning to FIG. 7, depicted therein is a bottom perspective view of case assembly 20 uncoupled from accessory assembly 10.

Figure 8:
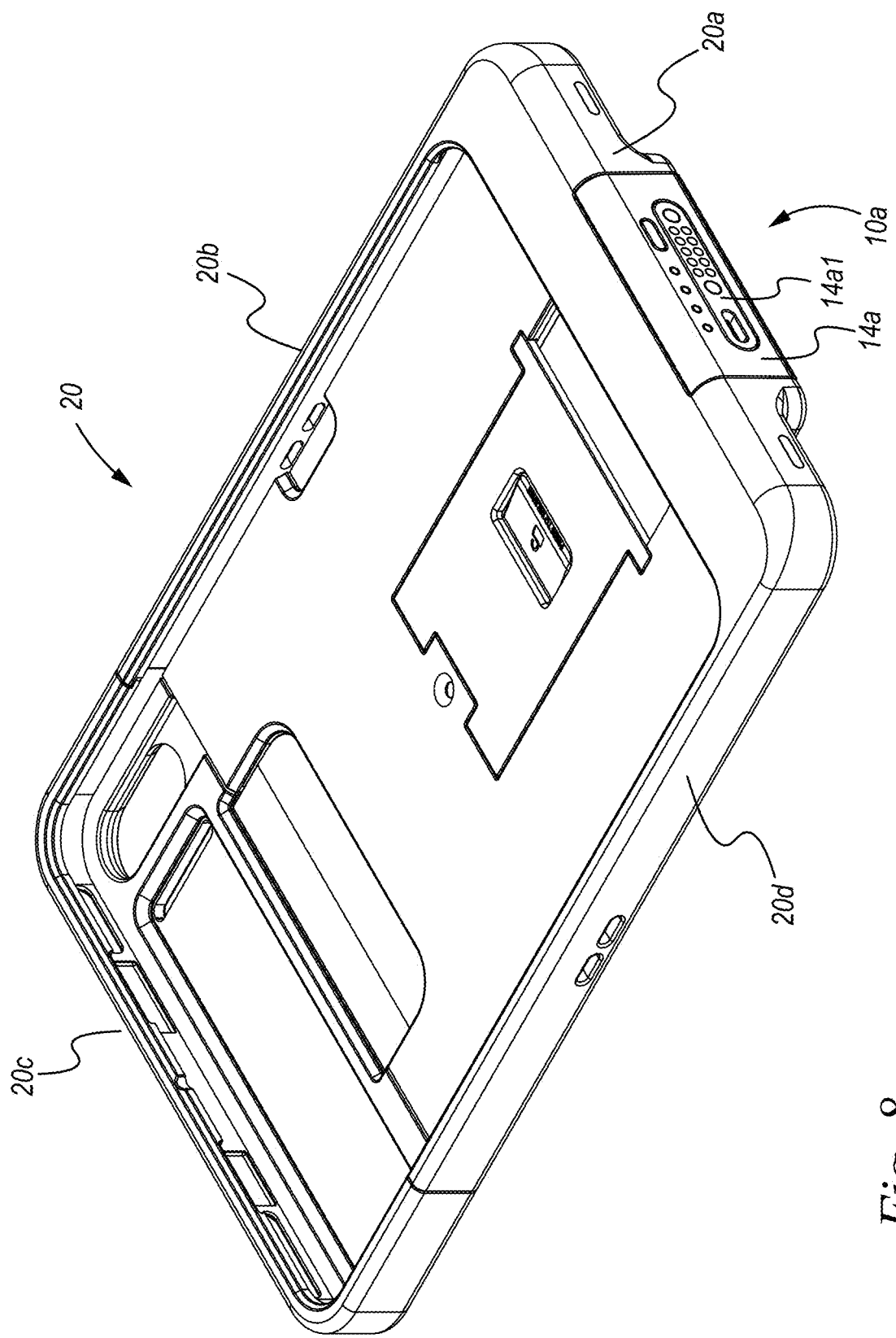
FIG. 8 is a first bottom perspective view of the case assembly of FIG. 5 coupled with the accessory assembly of FIG. 1.

Turning to FIG. 8, depicted therein is a first bottom perspective view of case assembly 20 coupled with accessory assembly 10.

Figure 9:
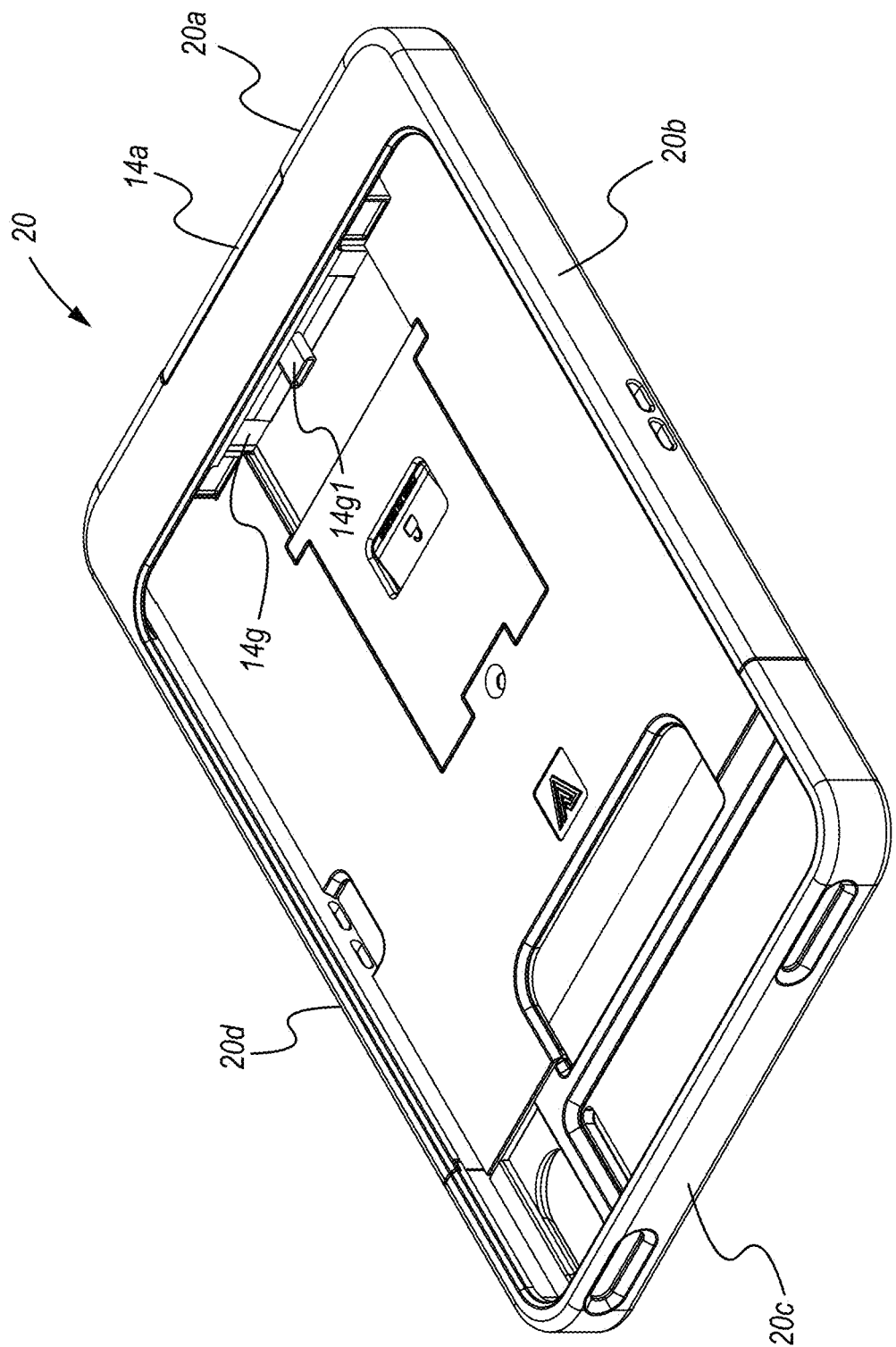
FIG. 9 is a second bottom perspective view of the case assembly of FIG. 5 coupled with the accessory assembly of FIG. 1.

Turning to FIG. 9, depicted therein is a second bottom perspective view of case assembly 20 coupled with accessory assembly 10.

Figure 10:
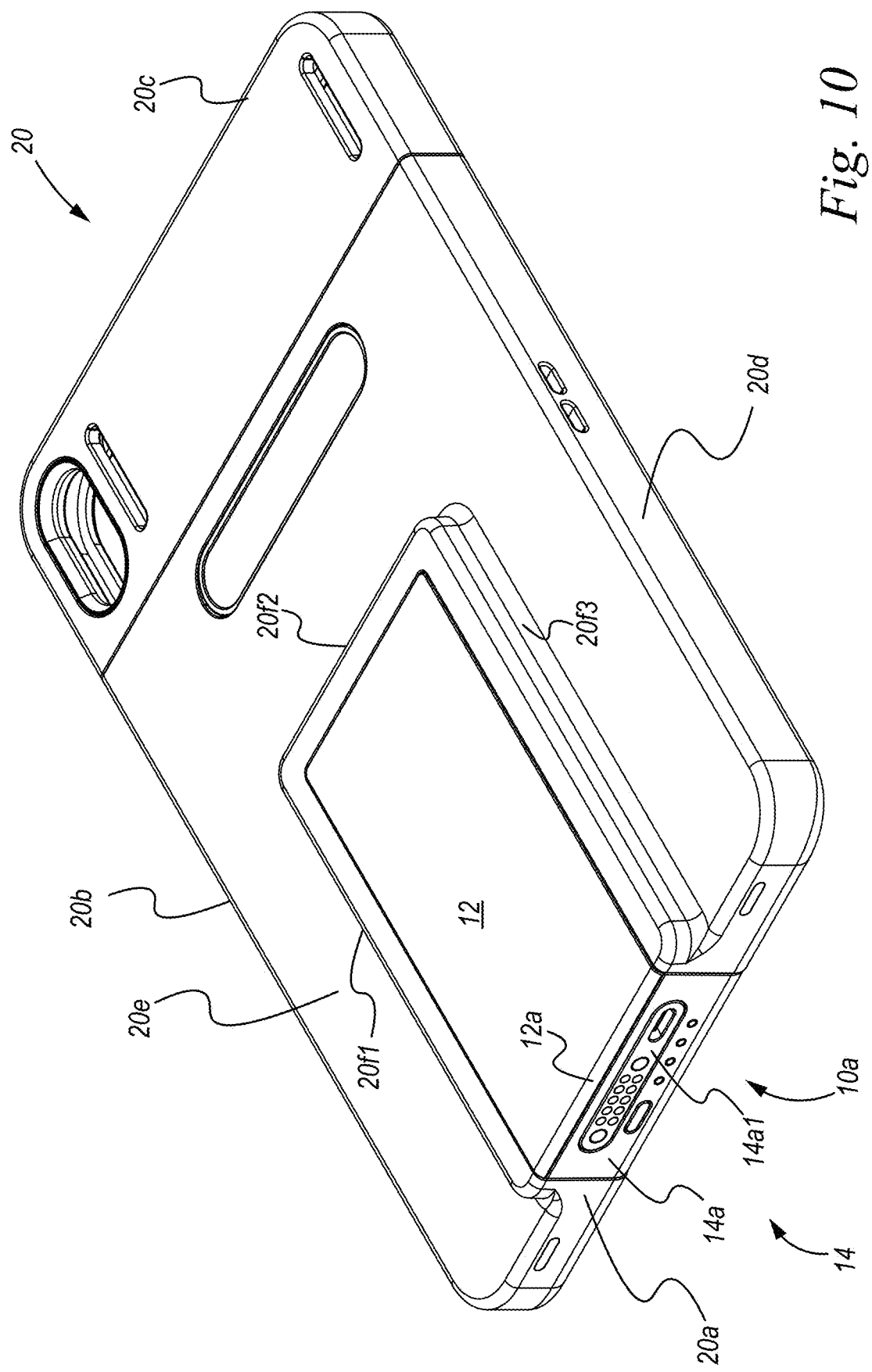
FIG. 10 is a first top perspective view of the case assembly of FIG. 5 coupled with the accessory assembly of FIG. 1.

Turning to FIG. 10, depicted therein is a first top perspective view of case assembly 20 coupled with accessory assembly 10.

Figure 11:
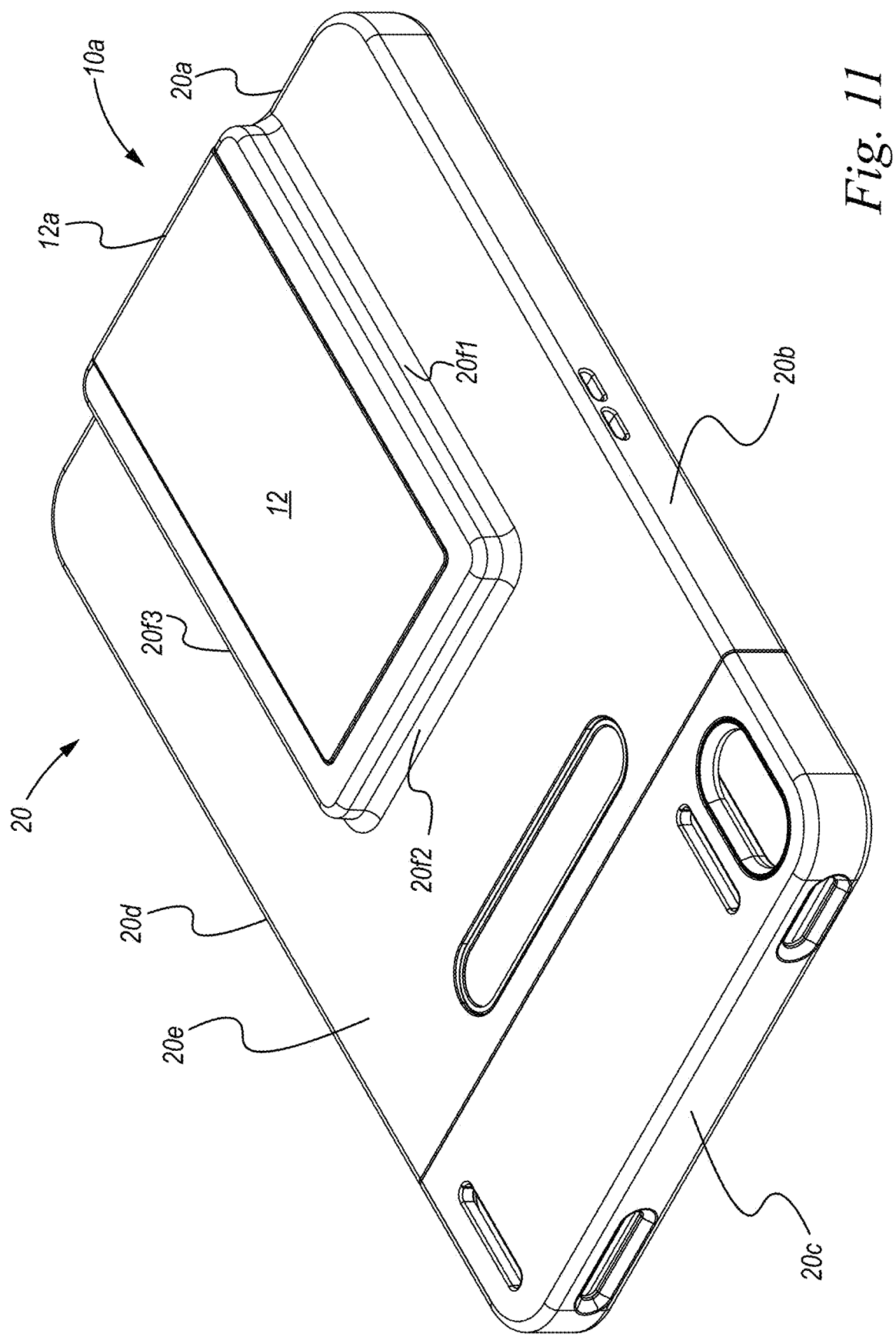
FIG. 11 is a second top perspective view of the case assembly of FIG. 5 coupled with the accessory assembly of FIG. 1.

Turning to FIG. 11, depicted therein is a second top perspective view of case assembly 20 coupled with accessory assembly 10.

Figure 12:
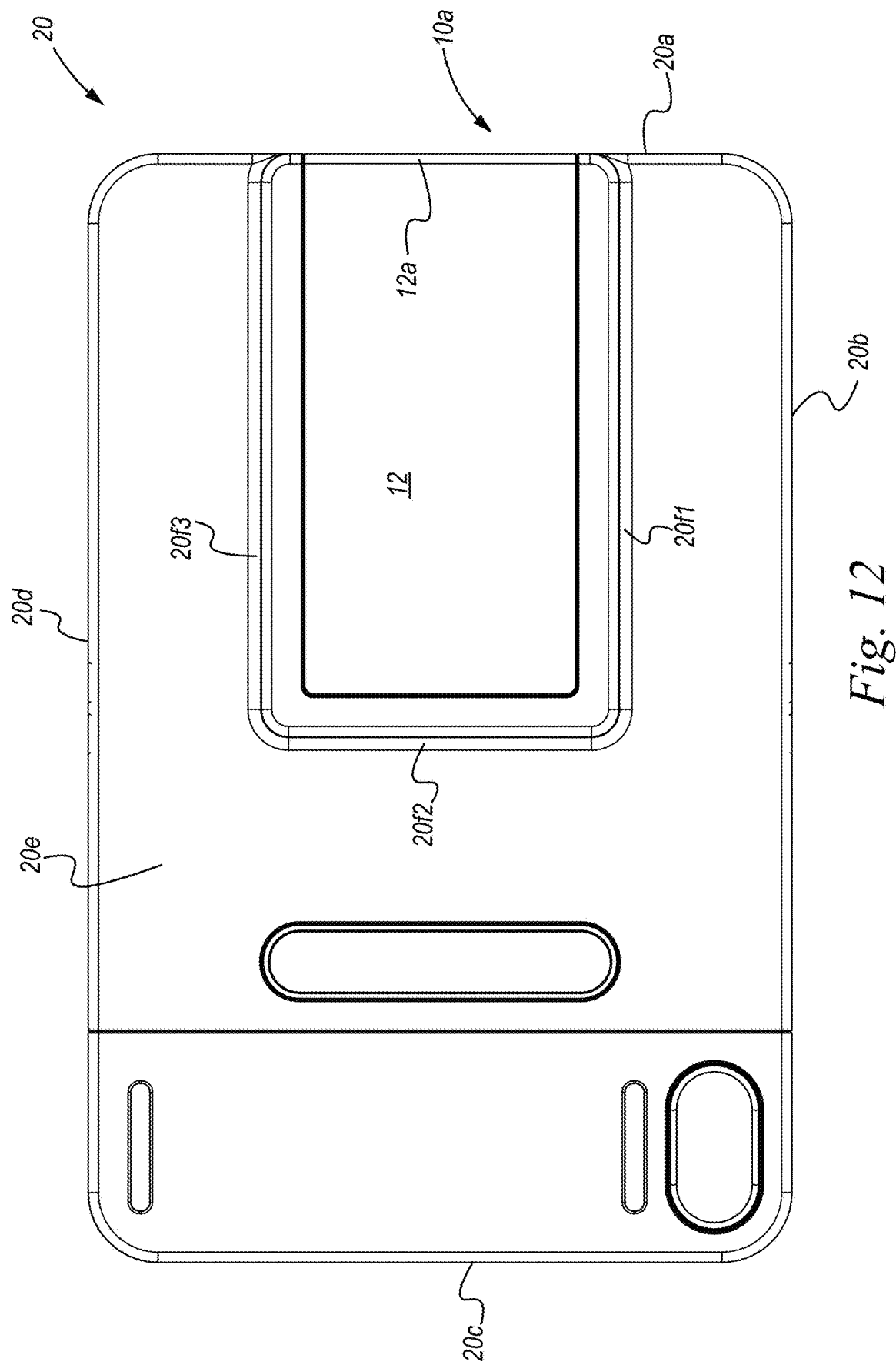
FIG. 12 is a top plan view of the case assembly of FIG. 5 coupled with the accessory assembly of FIG. 1.

Turning to FIG. 12, depicted therein is a top plan view of case assembly 20 coupled with accessory assembly 10.

Figure 13:
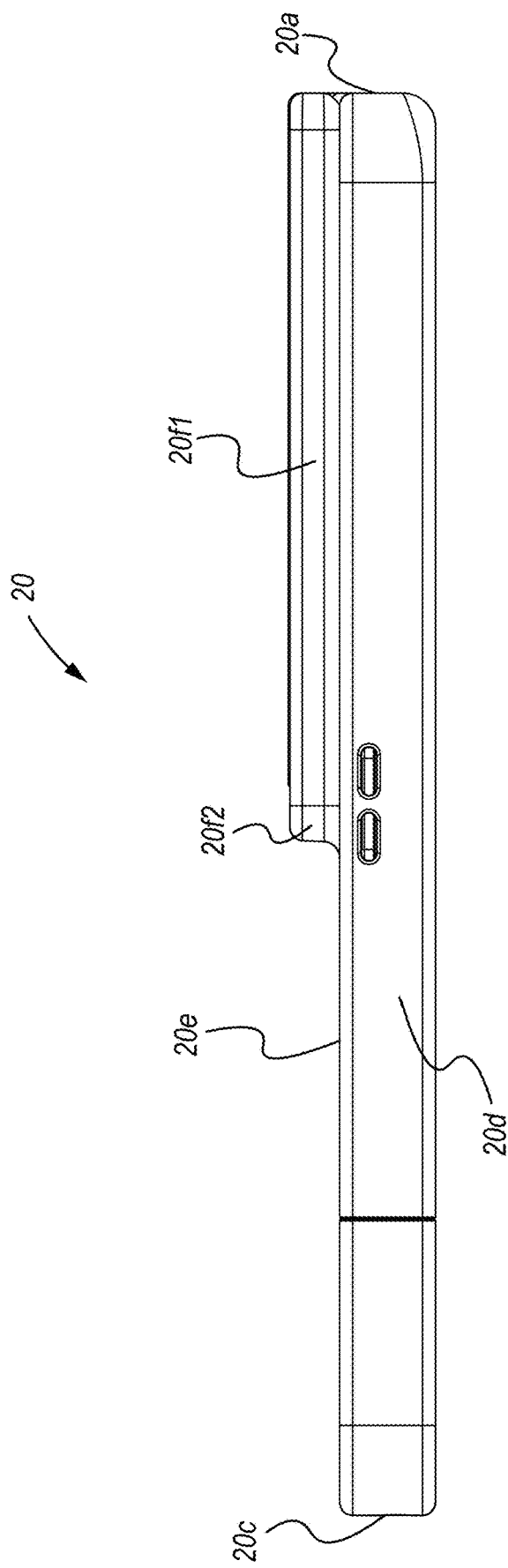
FIG. 13 is a side elevational view of the case assembly of FIG. 5 coupled with the accessory assembly of FIG. 1.

Turning to FIG. 13, depicted therein is a side elevational view of case assembly 20 coupled with accessory assembly 10.

Figure 14:
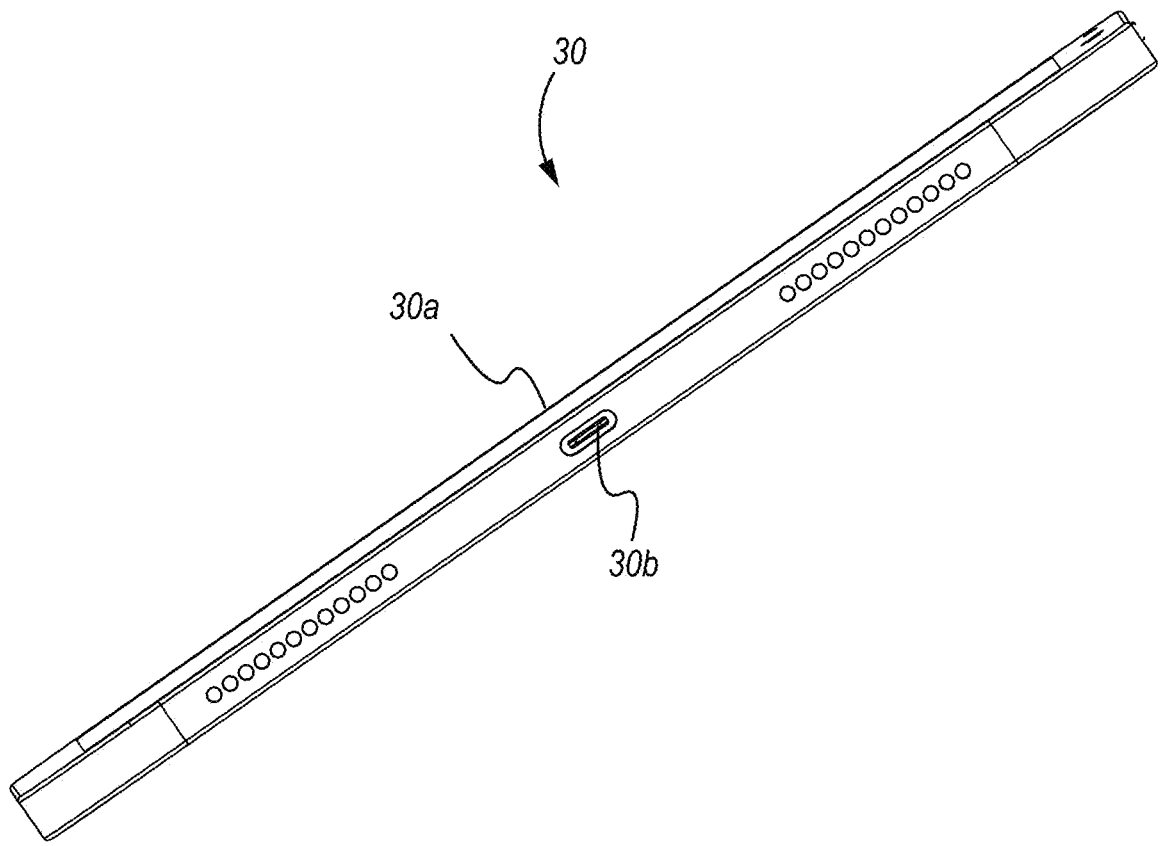
FIG. 14 is a side elevational of a portable electronic device.

Turning to FIG. 14, depicted therein is a side elevational view of portable electronic device 30 including display 30a and data-video-power connector port 30b.

Figure 15:
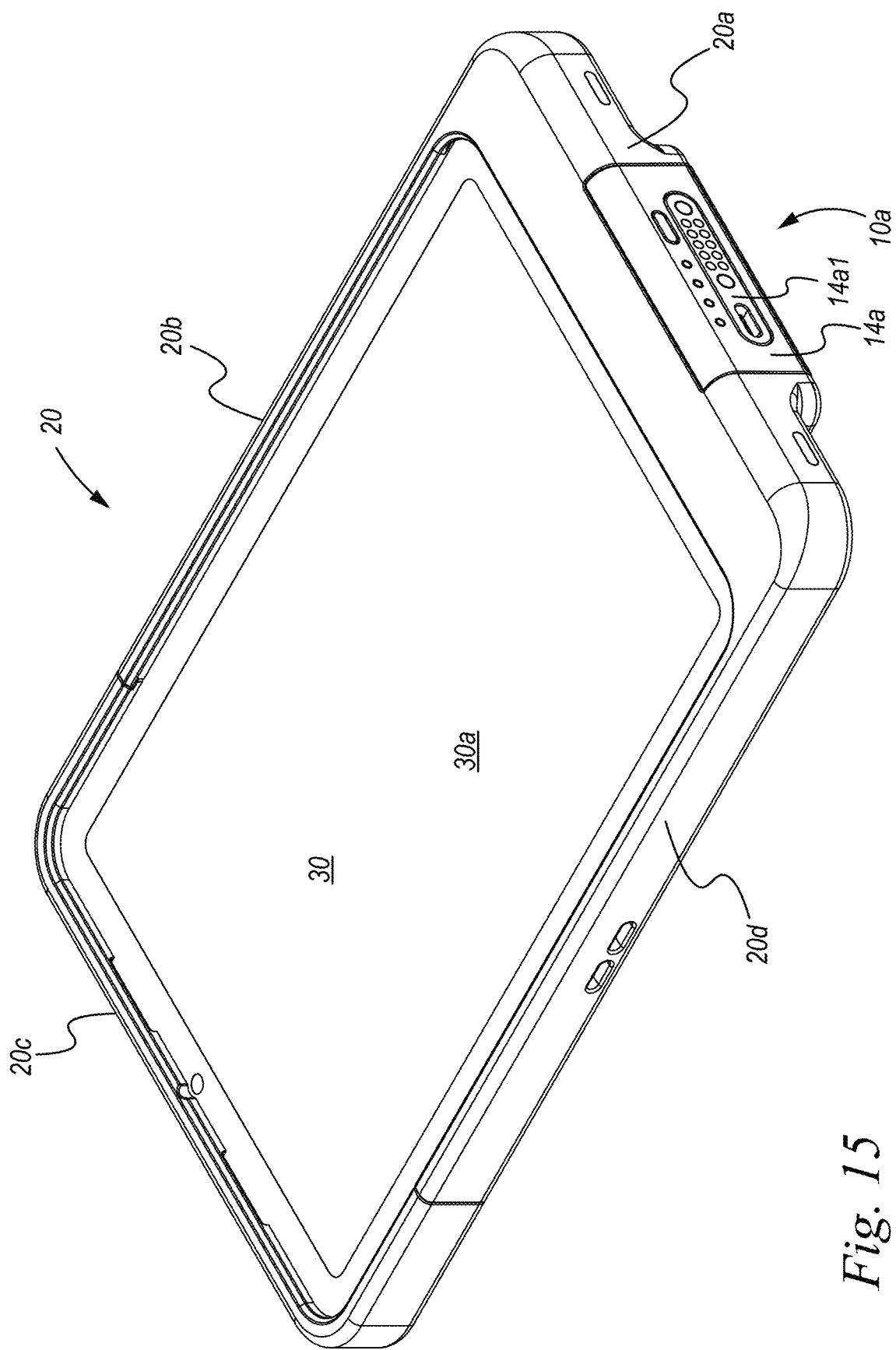
FIG. 15 is a first bottom perspective view of the case assembly of FIG. 5 coupled with the portable electronic device of FIG. 14, which are both coupled with the accessory assembly of FIG. 1.

Turning to FIG. 15, depicted therein is a first bottom perspective view of case assembly 20 coupled with portable electronic device 30, which are both coupled with accessory assembly 10.

Figure 16:
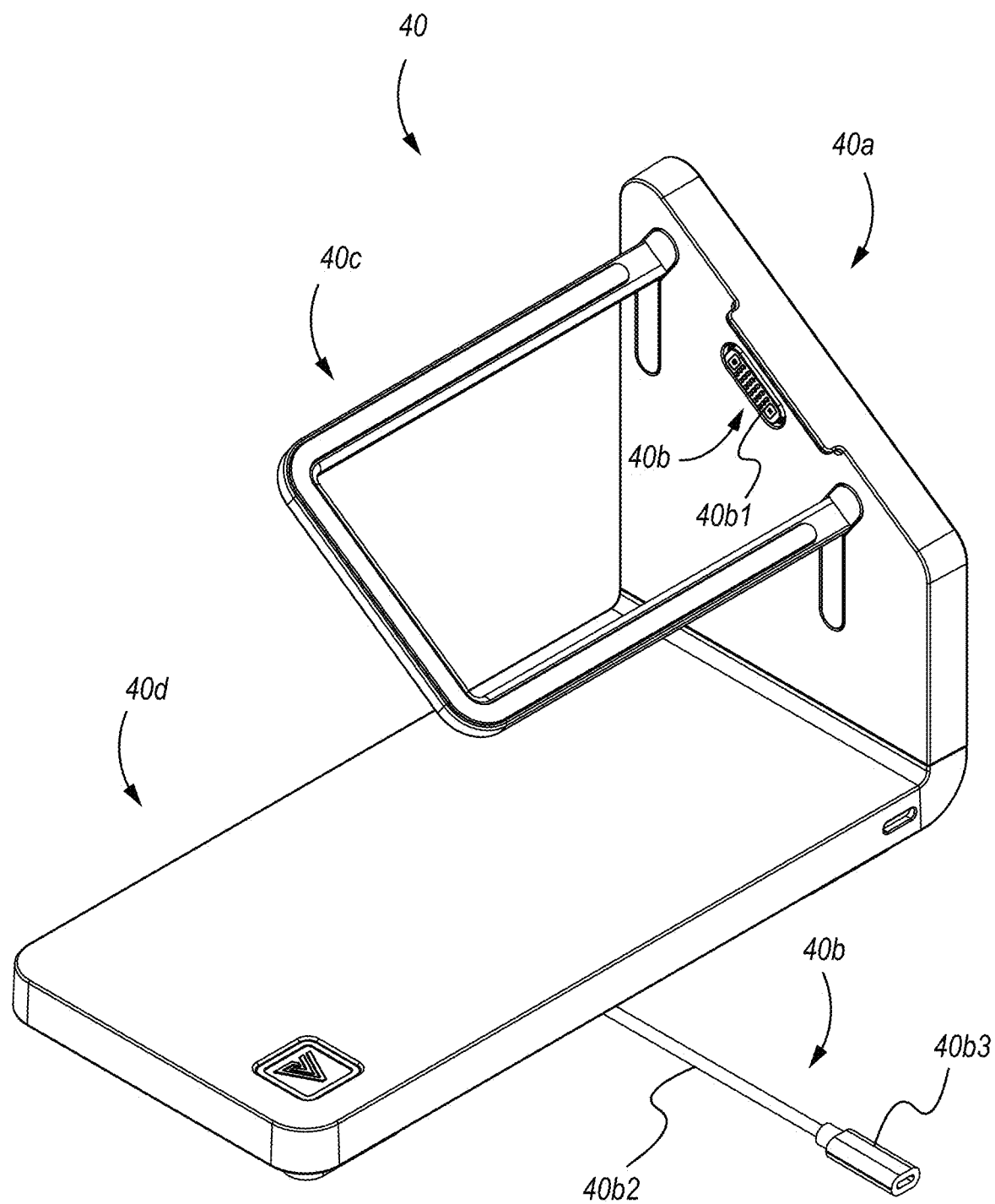
FIG. 16 is a top perspective view of a portable electronic device stand.

Turning to FIG. 16, depicted therein is a top perspective view of portable electronic device stand 40. Depicted implementation of portable electronic device stand 40 is shown to include wall assembly 40a, electrical cable assembly 40b with electrical contact pogo pin connector array 40b1, data-video-power electrical cable 40b2, and data-video-power connector port 40b3 (e.g., using one or more of those Universal Serial Bus (USB) specification standards connector port versions that can conduct data signals, video signals, and electrical power). In implementations portable electronic device stand 40 includes portable electronic device support assembly 40c and base assembly 40d.

Figure 16A:
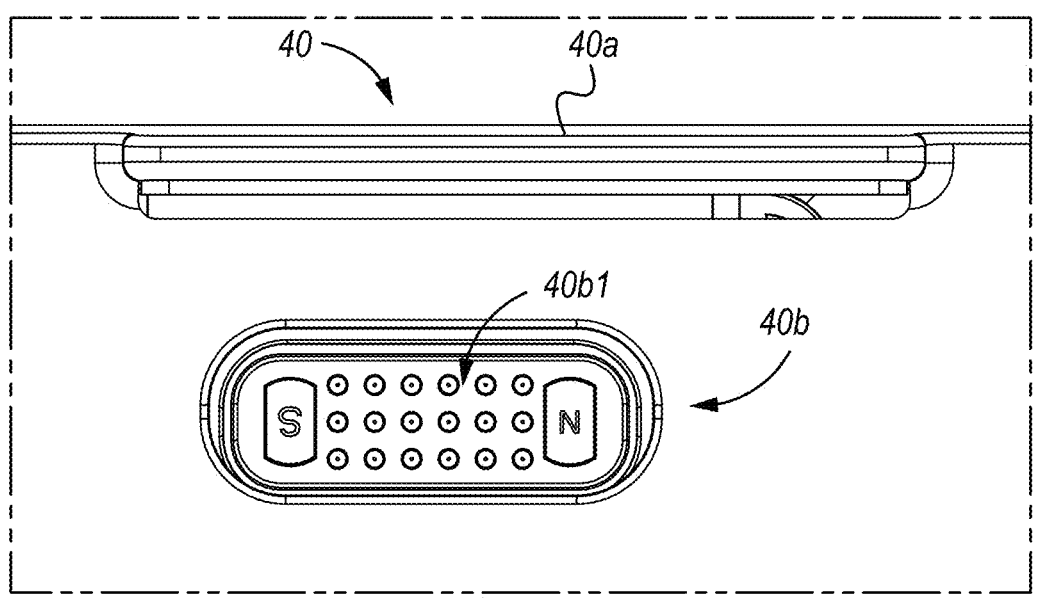
FIG. 16A is an enlarged side elevational view of a portion of the portable electronic device stand of FIG. 16.

Turning to FIG. 16A, depicted therein is an enlarged side elevational view of a portion of portable electronic device stand 40.

Figure 16B:
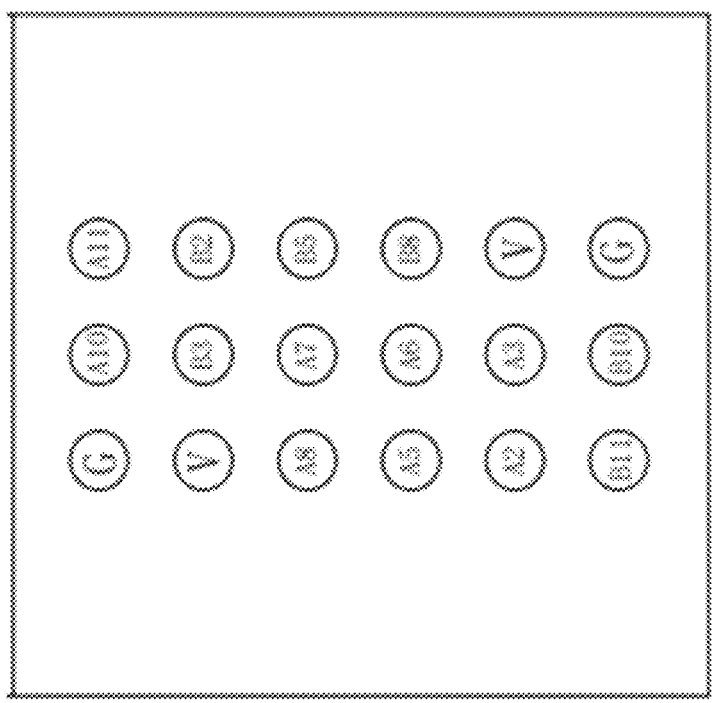
FIG. 16B is an electrical pin definition matrix associated with the portion of the portable electronic device stand of FIG. 16A.

Turning to FIG. 16B, depicted therein is an electrical pin definition matrix associated with the portion of portable electronic device stand 40 of FIG. 16A.

Figure 17:
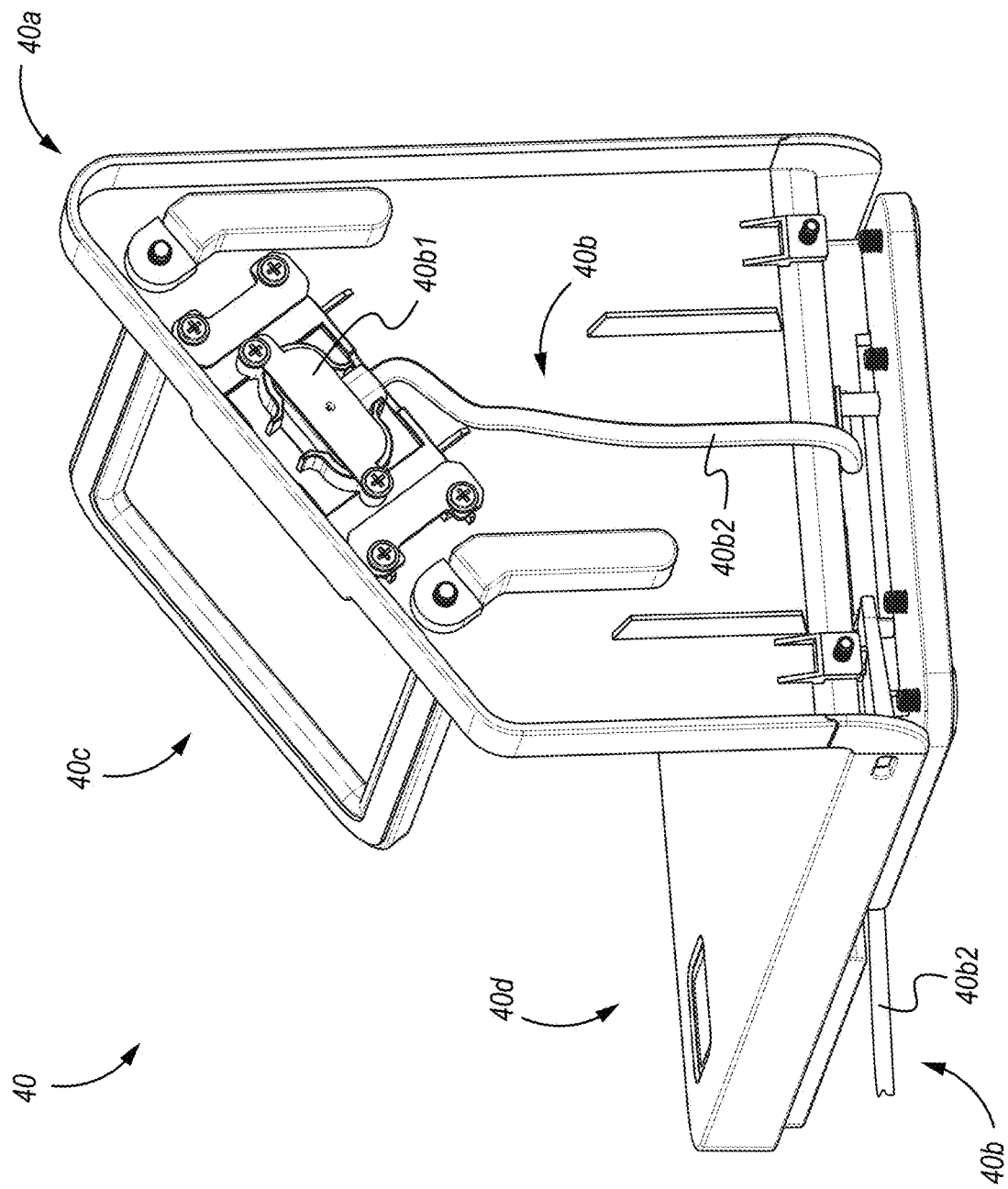
FIG. 17 is a rear perspective partially exploded view of the portable electronic device stand of FIG. 16.

Turning to FIG. 17, depicted therein is a rear perspective partially exploded view of portable electronic device stand 40.

Figure 18:
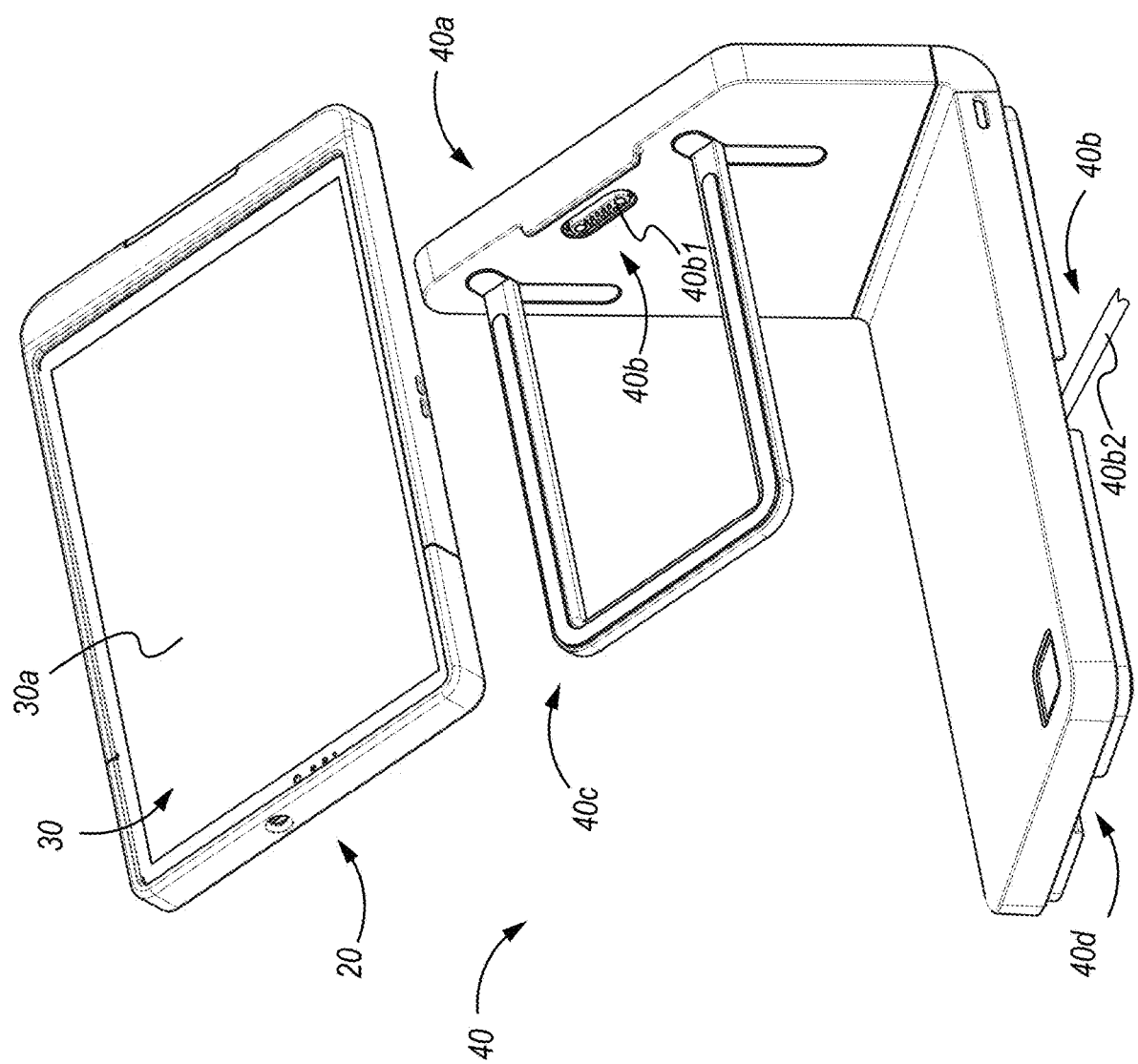
FIG. 18 is a front perspective view of the case assembly of FIG. 5 coupled with the portable electronic device of FIG. 14, which are both uncoupled from the portable electronic device stand of FIG. 16.

Turning to FIG. 18, depicted therein is a front perspective view of case assembly 20 coupled with portable electronic device 30, which are both uncoupled from portable electronic device stand 40

Figure 19:
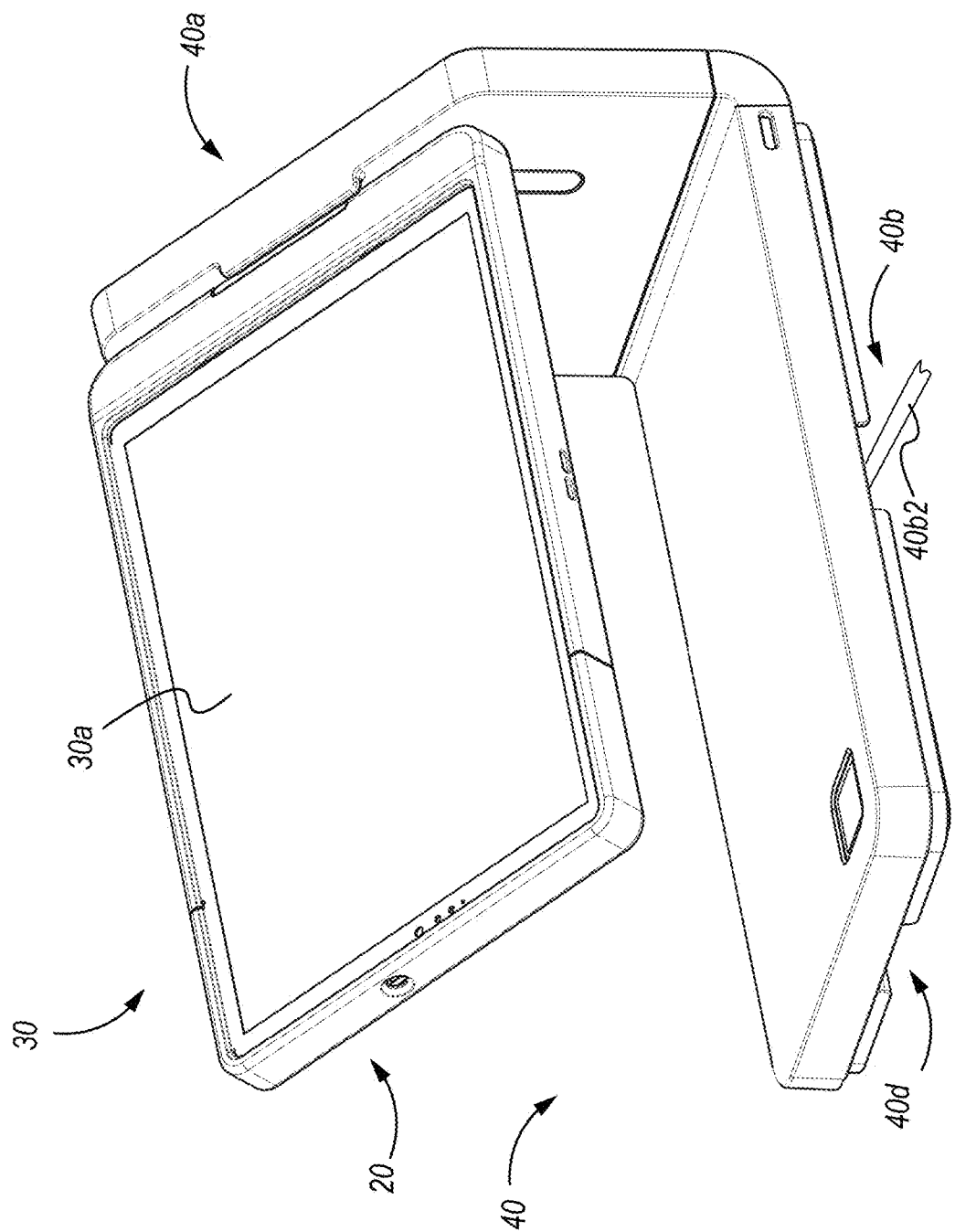
FIG. 19 is a front perspective view of the case assembly of FIG. 5 coupled with the portable electronic device of FIG. 14, which are both coupled with the portable electronic device stand of FIG. 16.

Turning to FIG. 19, depicted therein is a front perspective view of the case assembly of FIG. 5 coupled with portable electronic device 30, which are both coupled with portable electronic device stand 40.

Figure 20:
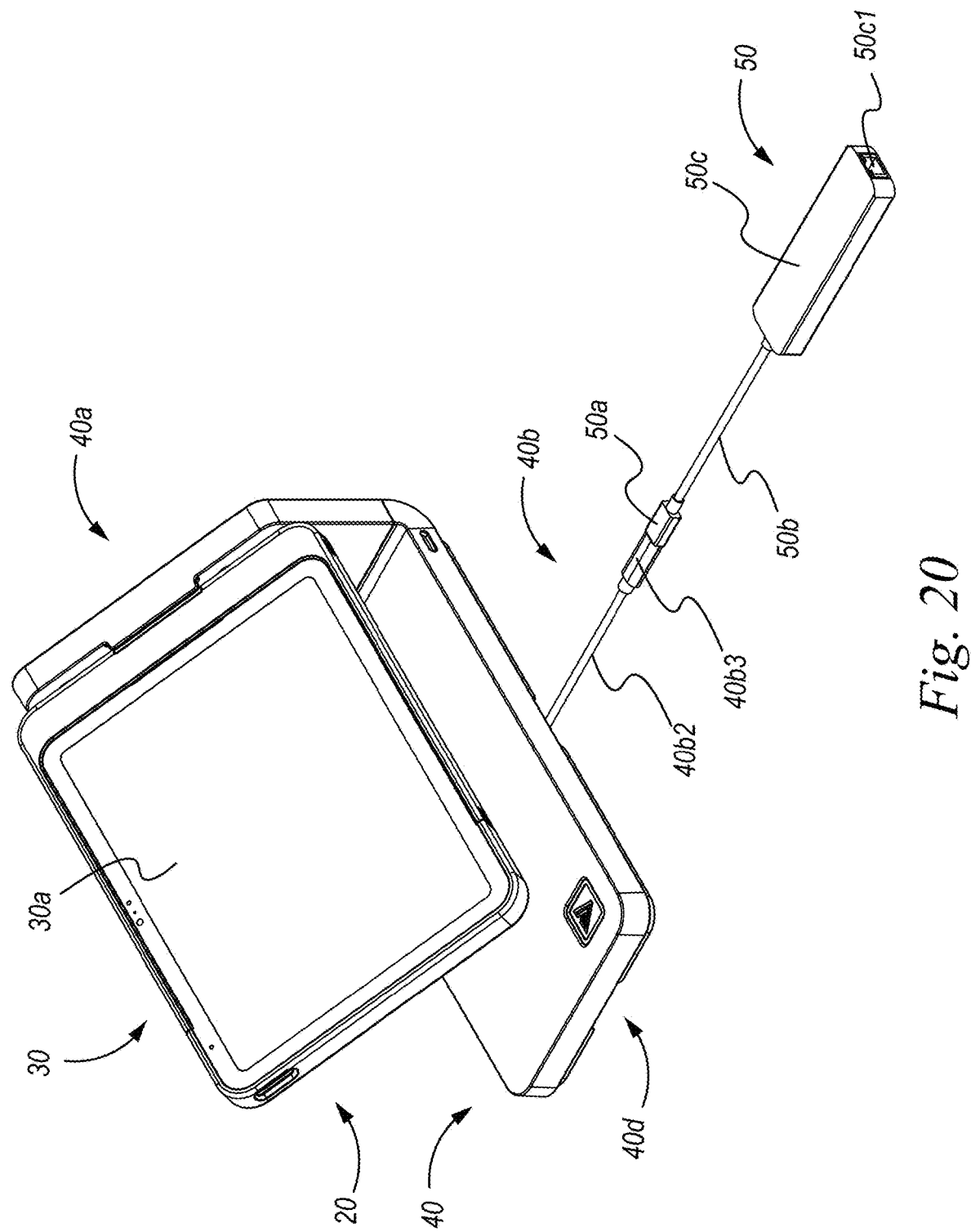
FIG. 20 is a front perspective view of the case assembly of FIG. 5 coupled with the portable electronic device of FIG. 14, which are both coupled with the portable electronic device stand of FIG. 16 being coupled with a data-video-power connector port hub assembly.

Turning to FIG. 20, depicted therein is a front perspective view of the case assembly of FIG. 5 coupled with portable electronic device 30, which are both coupled with portable electronic device stand 40 being coupled with data-video-power connector port hub system 50. Depicted implementation of data-video-power connector port hub system 50 is shown to include data-video-power electrical connector plug 50a (e.g., using one or more of those Universal Serial Bus (USB) specification standards connector plug versions that can conduct data signals, video signals, and electrical power), data-video-power electrical cable 50b, data-video-power connector port hub assembly 50c with multiple Universal Serial Bus (USB) specification standards connector ports complying with one or more of those USB specification standards versions that can conduct data signals, video signals, and electrical power and with network port 50cl (e.g., coupler for IEEE 802, ethernet, etc., network(s), etc.).

Turning to FIG. 21, depicted therein is a front perspective view of the case assembly of FIG. 5 coupled with portable electronic device 30, which are both coupled with portable electronic device stand 40 being coupled with data-video-power connector port hub system 50, which is coupled with display monitor assembly 60 with display 60a. Depicted implementation of data-video-power connector port hub system 50 is shown to include coupling with data-video-power electrical cable assembly 50d (e.g., USB cable or USB-HDMI hybrid cable, etc.) which allows for screen mirroring between display 30a of portable electronic device 30 and display 60a of display monitor assembly 60. In implementations data-video-power connector port hub system 50 can also include electrical coupling with computer mouse cable (e.g., USB mouse cable for mouse-based data control of portable electronic device 30), electrical power cable (e.g., USB power cable for electrical power supply to portable electronic device 30), keyboard cable (e.g., USB keyboard cable for keyboard data control of portable electronic device 30), network cable (e.g. ethernet cable, etc. for network access such as internet access for portable electronic device 30), etc.

While particular aspects of the present subject matter described herein have been shown and described, it will be apparent to those skilled in the art that, based upon the teachings herein, changes and modifications may be made without departing from the subject matter described herein and its broader aspects and, therefore, the appended claims are to encompass within their scope all such changes and modifications as are within the true spirit and scope of the subject matter described herein. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to claims containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that typically a disjunctive word and/or phrase presenting two or more alternative terms, whether in the description, claims, or drawings, should be understood to contemplate the possibilities of including one of the terms, either of the terms, or both terms unless context dictates otherwise. For example, the phrase "A or B" will be typically understood to include the possibilities of "A" or "B" or "A and B."

With respect to the appended claims, those skilled in the art will appreciate that recited operations therein may generally be performed in any order. Also, although various operational flows are presented in a sequence(s), it should be understood that the various operations may be performed in other orders than those which are illustrated, or may be performed concurrently. Examples of such alternate orderings may include overlapping, interleaved, interrupted, reordered, incremental, preparatory, supplemental, simultaneous, reverse, or other variant orderings, unless context dictates otherwise. Furthermore, terms like "responsive to," "related to," or other past-tense adjectives are generally not intended to exclude such variants, unless context dictates otherwise.

What is claimed is:

1. A data-video-power system comprising:
 (I) a data-video-power electrical cable first end having an electrical contact pin connector array;
 (II) a data-video-power electrical cable second end having a data-video-power connector port;
 (III) a data-video-power electrical cable coupled to the data-video-power cable first end and the data-video-power cable second end; and
 (IV) a portable electronic device stand,
 wherein the portable electronic device stand includes a base assembly,
 wherein the portable electronic device stand includes a wall assembly extending from the base assembly,
 wherein the portable electronic device stand includes a portable electronic device support assembly coupled with the wall assembly,
 wherein the data-video-power electrical cable first end is coupled with the wall assembly, and
 wherein the data-video-power electrical cable extends from the data-video-power electrical cable first end at least through a portion of the wall assembly and with a portion of the data-video-power electrical cable extending from the portable electronic device stand.

2. The system of claim 1 wherein the electrical contact pin connector array is an array of electrical contact pogo pins.

3. The system of claim 1 wherein the data-video-power connector port is configured to conduct data signals, video signals, and electrical power according to at least one version of Universal Serial Bus (USB) specification standards.

4. The system of claim 1, further including a data-video-power connector port hub assembly
wherein the data-video-power connector port hub assembly includes a plurality of data-video-power connector ports, and
wherein the data-video-power connector port hub assembly includes a data-video-power electrical connector plug electrically couplable with the data-video-power connector port of the data-video-power electrical cable second end.

5. The system of claim 4, further including a display monitor assembly and a data-video electrical cable,
wherein the data-video electrical cable includes at least one connector plug configured to conduct data signals and video signals according to at least one version of Universal Serial Bus (USB) specification standards,
wherein the plurality of data-video-power connector ports is configured to conduct data signals, video signals, and electrical power according to at least one version of Universal Serial Bus (USB) specification standards, and
wherein the display monitor assembly is electrically couplable to the data-video-power connector port hub assembly via the data-video electrical cable.

6. A system for a portable electronic device including a data-video-power connector port comprising:
(I) a case for coupling with the portable electronic device; and
(II) a portable electronic device accessory;
wherein the portable electronic device accessory is couplable to the case,
wherein the portable electronic device accessory includes a data-video-power electrical connector plug couplable with the data-video-power connector port of the portable electronic device,
wherein the portable electronic device accessory includes an electrical contact pogo pin target connector array, and
wherein the portable electronic device accessory conducts data signals, video signals, and electrical power received by the electrical contact pogo pin target connector array on to the data-video-power electrical connector plug.

7. The system of claim 6 wherein the data-video-power electrical connector plug is configured to conduct data signals, video signals, and electrical power according to at least one version of Universal Serial Bus (USB) specification standards.

8. The system of claim 7 wherein the electrical contact pogo pin target connector array includes eighteen external electrical pogo pin target contracts directly electrically coupled to the data-video-power electrical connector plug.

9. The system of claim 8, further including a portable electronic device stand
wherein the portable electronic device stand includes a base assembly,
wherein the portable electronic device stand includes a wall assembly extending from the base assembly,
wherein the portable electronic device stand includes a portable electronic device support assembly coupled with the wall assembly,
wherein the portable electronic device stand includes a data-video-power electrical cable with a data-video-power electrical cable first end coupled with the wall assembly and a data-video-power electrical cable second end having a data-video-power connector port,
wherein the data-video-power electrical cable first end of the electrical cable is electrically couplable with the electrical contact pogo pin target connector array of the portable electronic device accessory, and
wherein the data-video-power electrical cable extends from the cable first end at least through a portion of the wall assembly with a portion of the data-video-power electrical cable extending from the portable electronic device stand.

10. The system of claim 9, further including a data-video-power connector port hub assembly
wherein the data-video-power connector port hub assembly includes a data-video-power electrical connector plug electrically couplable with the data-video-power connector port of the data-video-power electrical cable.

11. The system of claim 10, further including a display monitor assembly
wherein the display monitor assembly is electrically couplable with the data-video-power connector port hub assembly via a data-video electrical cable.

12. The system of claim 9,
wherein the data-video-power electrical cable first end includes eighteen external electrical pogo pins of an electrical contact pogo pin connector array, and
wherein the data-video-power connector port of the data-video-power electrical cable second end is configured to conduct data signals, video signals, and electrical power according to at least one version of Universal Serial Bus (USB) specification standards.

13. A system for a portable electronic device including a data-video-power connector port comprising:
(I) a portable electronic device stand including
a base assembly,
a wall assembly extending from the base assembly,
a portable electronic device support assembly coupled with the wall assembly,
a data-video-power electrical cable with a data-video-power electrical cable first end coupled with the wall assembly and a data-video-power electrical cable second end having a data-video-power connector port,
(II) a portable electronic device accessory including an electrical contact pogo pin target connector array and a data-video-power electrical connector plug,
wherein the electrical contact pogo pin target connector array is directly electrically coupled with the data-video-power electrical connector plug so that data signals, video signals, and electrical power received by the electrical contact pogo pin target connector array is conducted on to the data-video-power electrical connector plug,
wherein the data-video-power electrical cable first end of the data-video-power electrical cable is electrically couplable with an electrical contact pogo pin target connector array of the portable electronic device accessory, and
wherein the data-video-power electrical cable extends from the cable first end at least through a portion of the wall assembly with a portion of the data-video-power electrical cable extending from the portable electronic device stand.

14. The system of claim 13, further including a data-video-power connector port hub assembly
wherein the data-video-power connector port hub assembly includes a data-video-power electrical connector plug electrically couplable with the data-video-power connector port of the data-video-power electrical cable.

15. The system of claim 14, further including a display monitor assembly wherein the display monitor assembly is electrically couplable with the data-video-power connector port hub assembly via a data-video electrical cable.

16. The system of claim 13,
wherein the data-video-power electrical cable first end includes an array of eighteen electrical pogo pins of an electrical contact pogo pin connector array, and
wherein the data-video-power connector port of the data-video-power electrical cable second end is configured to conduct data signals, video signals, and electrical power according to at least one version of Universal Serial Bus (USB) specification standards.

17. The system of claim 16,
wherein the electrical contact pogo pin target connector array of the portable electronic device accessory includes an array of eighteen electrical contact pogo pin targets, and
wherein the data-video-power electrical connector plug is configured to conduct data signals, video signals, and electrical power according to at least one version of Universal Serial Bus (USB) specification standards.

18. The system of claim 13, further including
a case for coupling with the portable electronic device;
wherein the portable electronic device accessory is couplable to the case.

19. The system of claim 13,
wherein the data-video-power electrical connector plug of portable electronic device accessory is configured to conduct data signals, video signals, and electrical power according to at least one version of Universal Serial Bus (USB) specification standards.

* * * * *